United States Patent
Ladd et al.

(10) Patent No.: US 10,165,209 B2
(45) Date of Patent: *Dec. 25, 2018

(54) LOW-NOISE, HIGH DYNAMIC-RANGE IMAGE SENSOR

(71) Applicant: Rambus Inc., Sunnyvale, CA (US)

(72) Inventors: John Ladd, Santa Clara, CA (US); Michael Guidash, Rochester, NY (US); Craig M. Smith, Spencerport, NY (US); Thomas Vogelsang, Mountain View, CA (US); Jay Endsley, San Jose, CA (US); Michael T. Ching, Los Altos, CA (US); James E. Harris, Tyler, TX (US)

(73) Assignee: Rambus Inc., Sunnyvale, CA (US)

(*) Notice: Subject to any disclaimer, the term of this patent is extended or adjusted under 35 U.S.C. 154(b) by 11 days.

This patent is subject to a terminal disclaimer.

(21) Appl. No.: 15/328,207

(22) PCT Filed: Jul. 23, 2015

(86) PCT No.: PCT/US2015/041844
§ 371 (c)(1),
(2) Date: Jan. 23, 2017

(87) PCT Pub. No.: WO2016/014860
PCT Pub. Date: Jan. 28, 2016

(65) Prior Publication Data
US 2017/0214869 A1    Jul. 27, 2017

Related U.S. Application Data

(60) Provisional application No. 62/029,392, filed on Jul. 25, 2014.

(51) Int. Cl.
*H04N 5/365*   (2011.01)
*H04N 5/3745*   (2011.01)
(Continued)

(52) U.S. Cl.
CPC ........ *H04N 5/3655* (2013.01); *H04N 5/355* (2013.01); *H04N 5/357* (2013.01); *H04N 5/3575* (2013.01);
(Continued)

(58) Field of Classification Search
CPC ...... H04N 5/378; H04N 5/361; H04N 5/3572; H04N 5/3745; H04N 5/37455; H03M 1/004; H03M 1/007; H03M 1/56
See application file for complete search history.

(56) References Cited

U.S. PATENT DOCUMENTS 6,009,201 A    12/1999   Acharya
8,169,517 B2    5/2012   Poonnen et al.
(Continued)

OTHER PUBLICATIONS

Notification Concerning Transmittal of International Preliminary Report on Patentability dated Feb. 9, 2017 re: Int'l Appln. No. PCT/US15/041844. 11 Pages.
(Continued)

*Primary Examiner* — Nhan T Tran
*Assistant Examiner* — Chriss Yoder, III
(74) *Attorney, Agent, or Firm* — Charles Shemwell

(57) ABSTRACT

A sequence of control voltage levels are applied to a control signal line capacitively coupled to a floating diffusion node of a pixel to sequentially adjust a voltage level of the floating diffusion node. A pixel output signal representative of the voltage level of the floating diffusion node is compared with a reference voltage to identify a first control voltage level of the sequence of control voltage levels for which the voltage level of the floating diffusion node exceeds the reference voltage.

20 Claims, 17 Drawing Sheets

(51) Int. Cl.
  *H04N 5/378* (2011.01)
  *H04N 5/355* (2011.01)
  *H04N 5/357* (2011.01)
  *H04N 5/369* (2011.01)

(52) U.S. Cl.
  CPC ......... *H04N 5/3651* (2013.01); *H04N 5/3698* (2013.01); *H04N 5/378* (2013.01); *H04N 5/3745* (2013.01); *H04N 5/37455* (2013.01)

(56) References Cited

U.S. PATENT DOCUMENTS

| | | | |
|---|---|---|---|
| 8,310,581 | B2 | 11/2012 | Itakura et al. |
| 8,575,533 | B2 | 11/2013 | Yen et al. |
| 8,730,363 | B2 | 5/2014 | Nishi |
| 9,001,251 | B2 | 4/2015 | Smith et al. |
| 9,325,335 | B1 | 4/2016 | Milkov |
| 2003/0206236 | A1* | 11/2003 | Levantovsky ......... H04N 3/155 348/310 |
| 2003/0214597 | A1 | 11/2003 | Nam |
| 2008/0192127 | A1 | 8/2008 | Sakai et al. |
| 2010/0265374 | A1 | 10/2010 | Nishi |
| 2011/0036969 | A1 | 2/2011 | Ahn et al. |
| 2011/0074994 | A1* | 3/2011 | Wakabayashi ...... H03M 1/0658 348/302 |
| 2013/0009043 | A1 | 1/2013 | Mao et al. |
| 2015/0021461 | A1 | 1/2015 | Nishihara et al. |

OTHER PUBLICATIONS

Notification of Transmittal of the International Search Report and Written Opinion of the International Searching Authority dated Dec. 21, 2015 re Int'l Appln. No. PCT/US2015/041844. 16 Pages.

PCT—Invitation to Pay Additional Fees and, Where Applicable, Protest Fee dated Oct. 7, 2015 re Int'l. Appln. No. PCT/US2015/041844. 6 Pages.

* cited by examiner

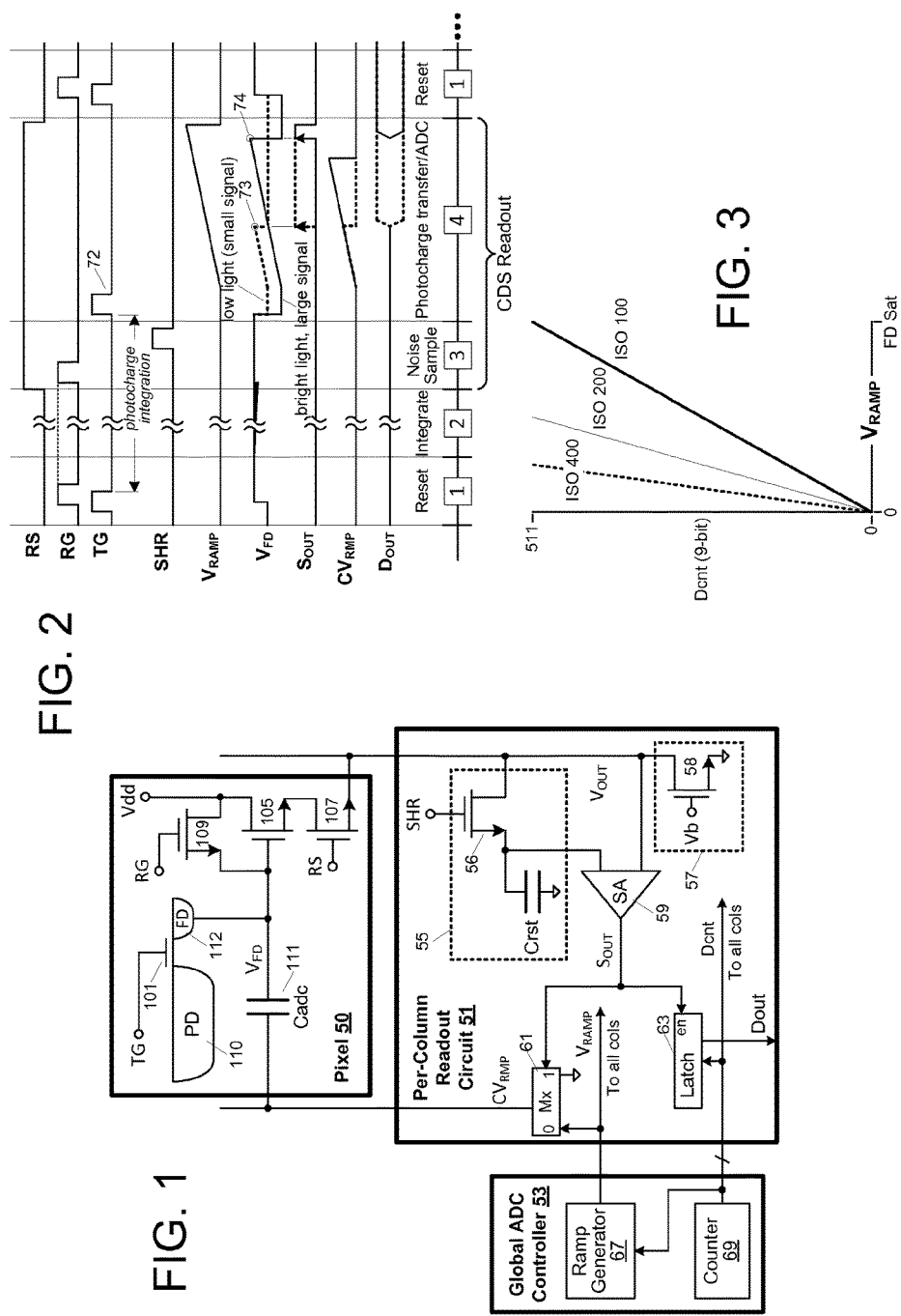

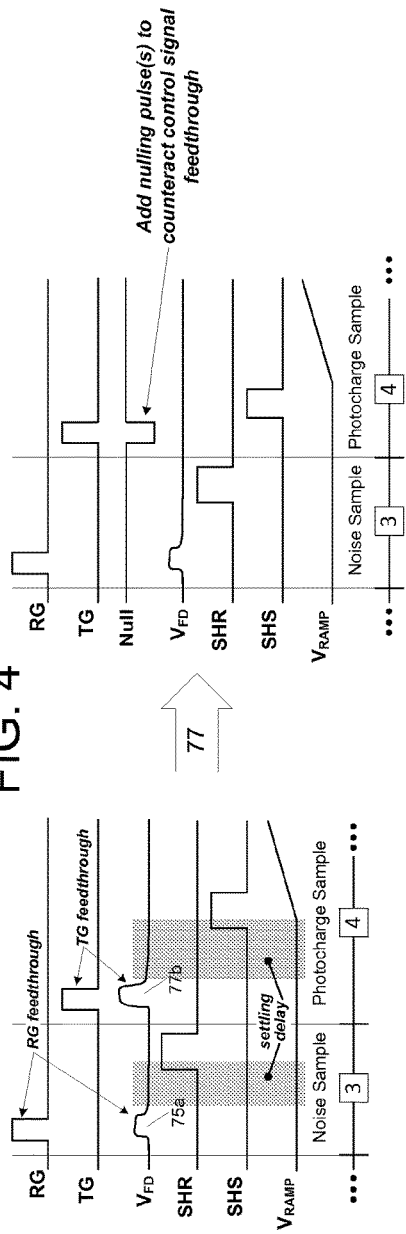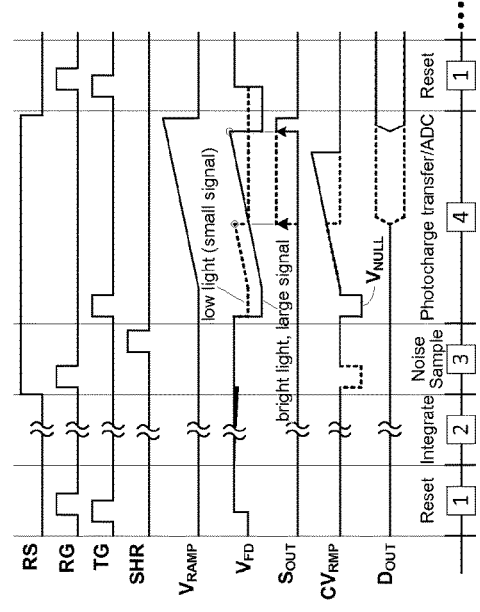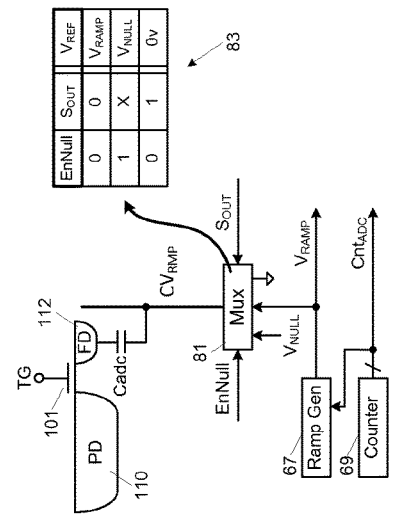

FIG. 7D
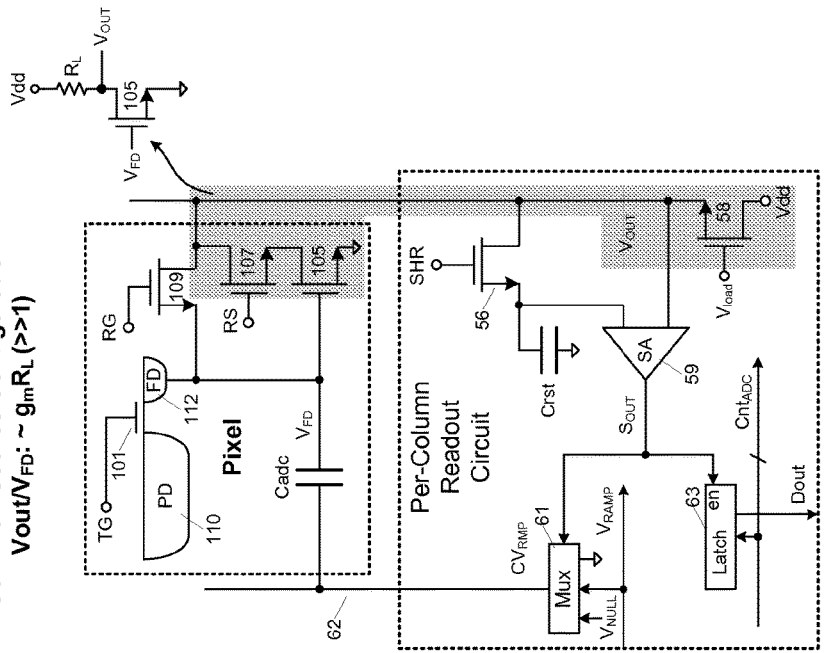
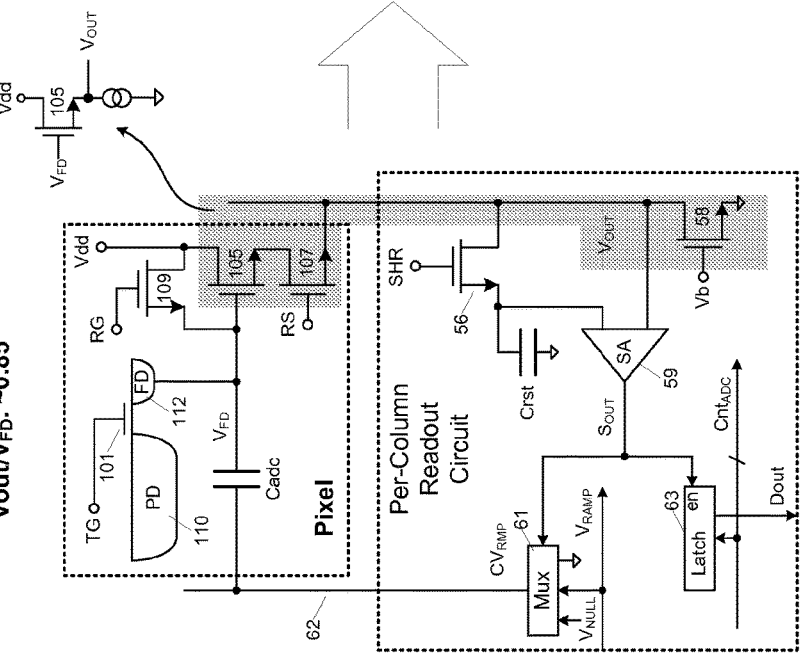

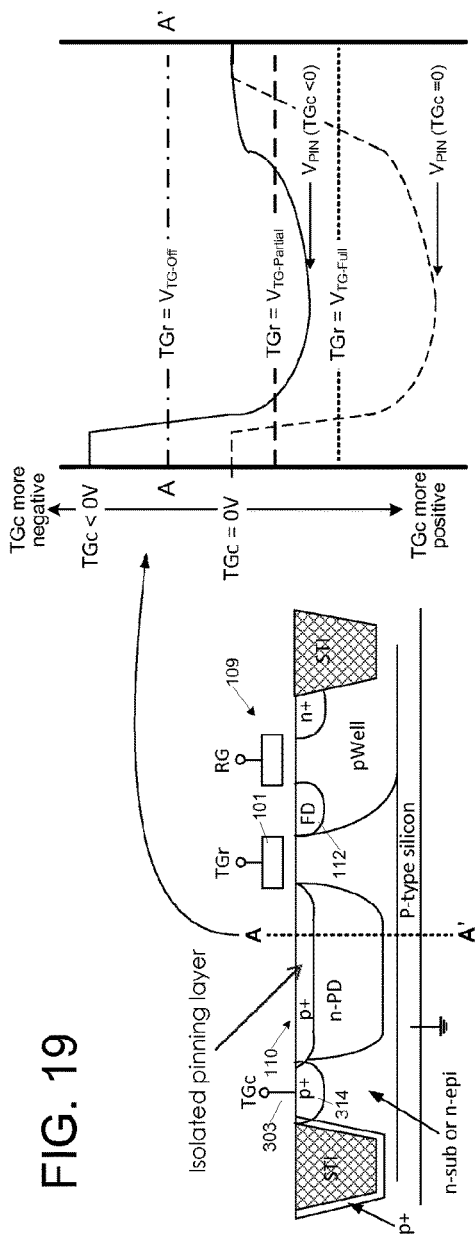
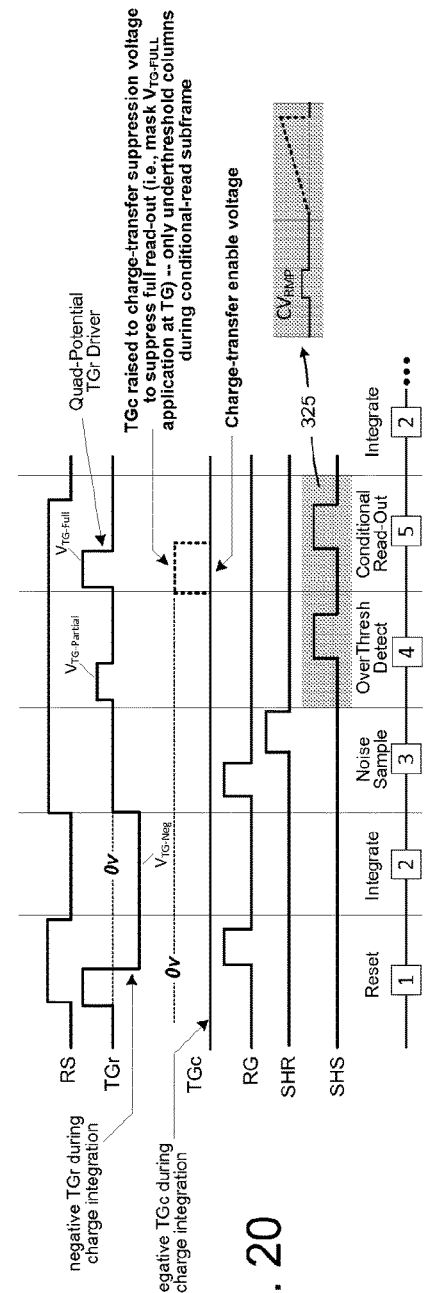
FIG. 19
FIG. 20

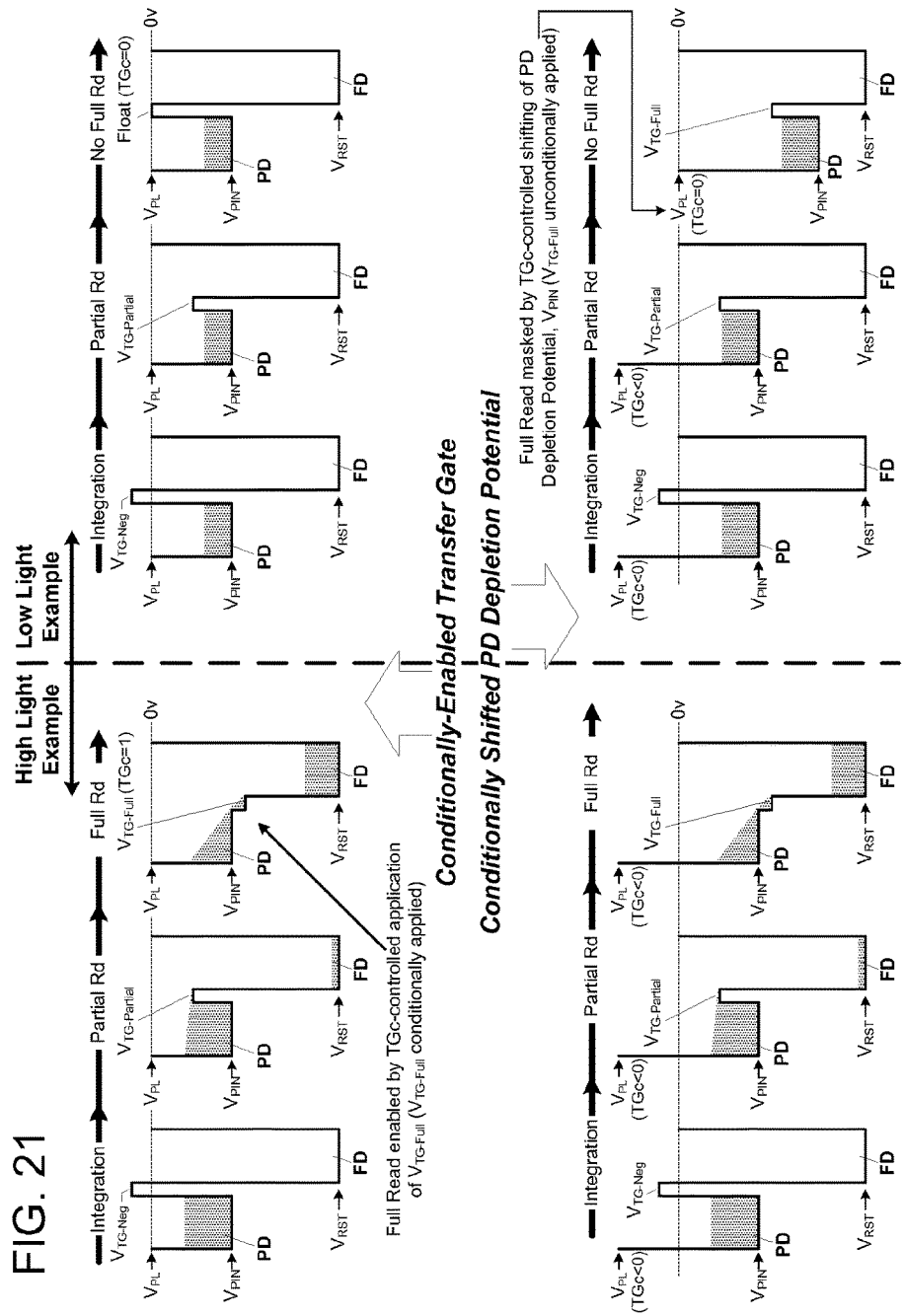

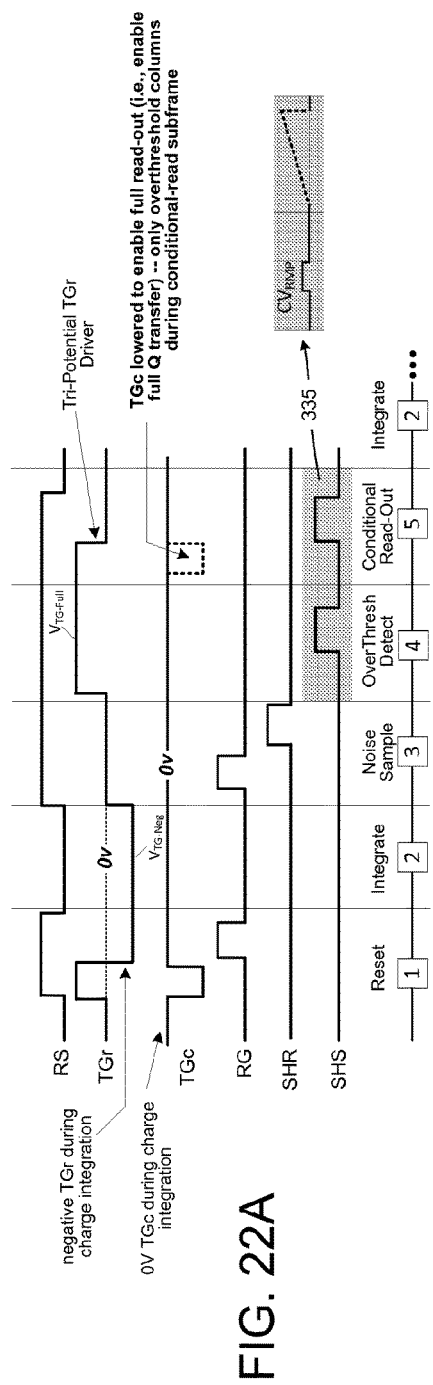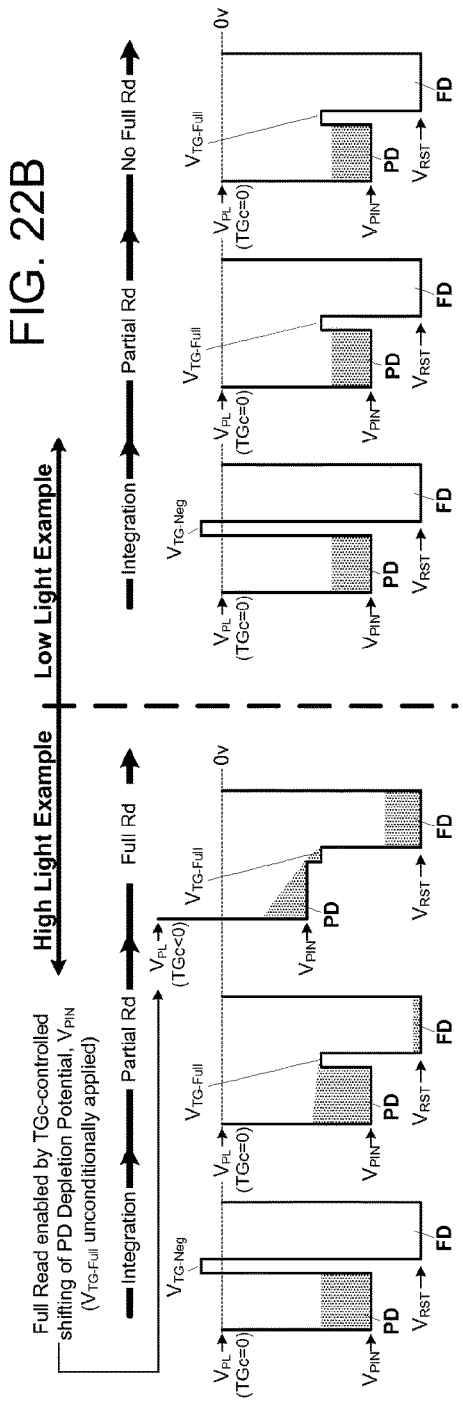

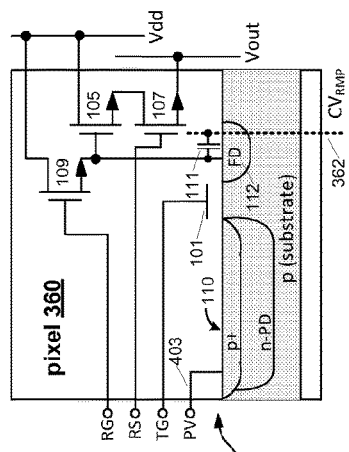
FIG. 23
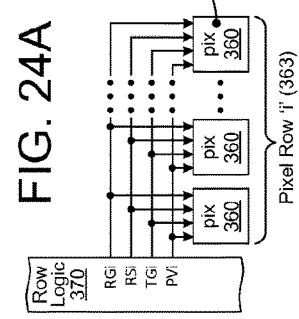
FIG. 24A
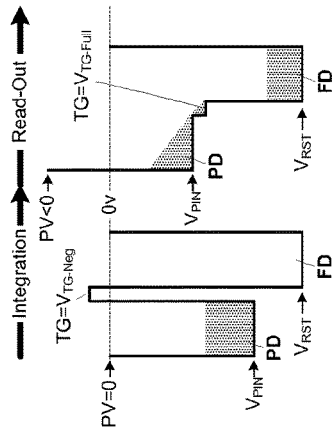
FIG. 24C
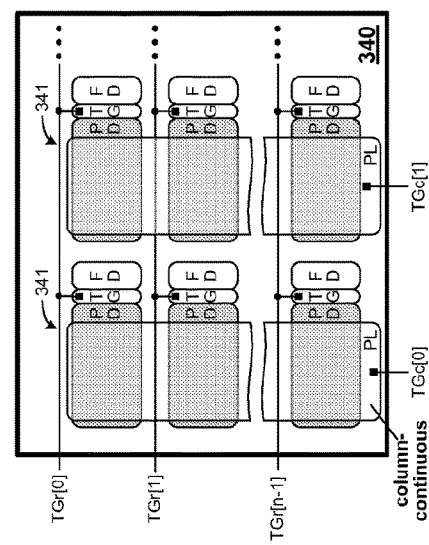
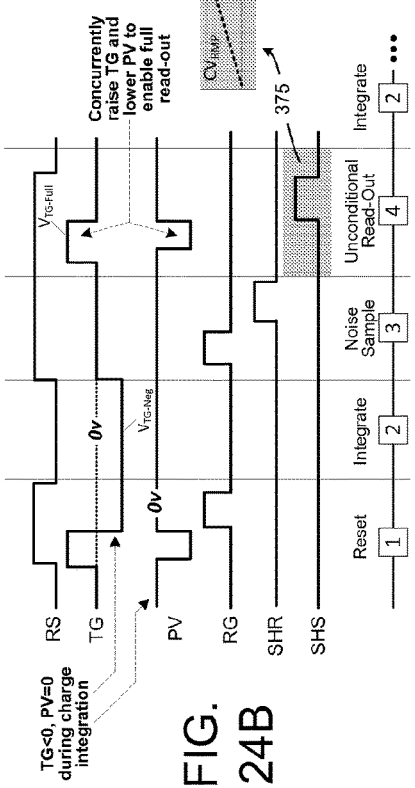
FIG. 24B

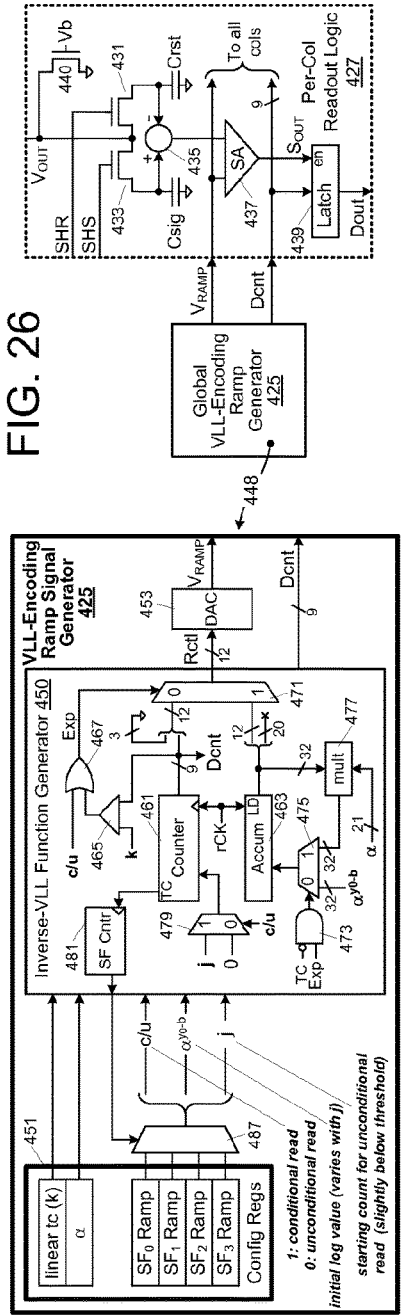
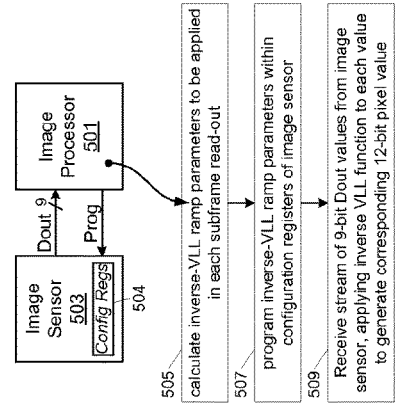
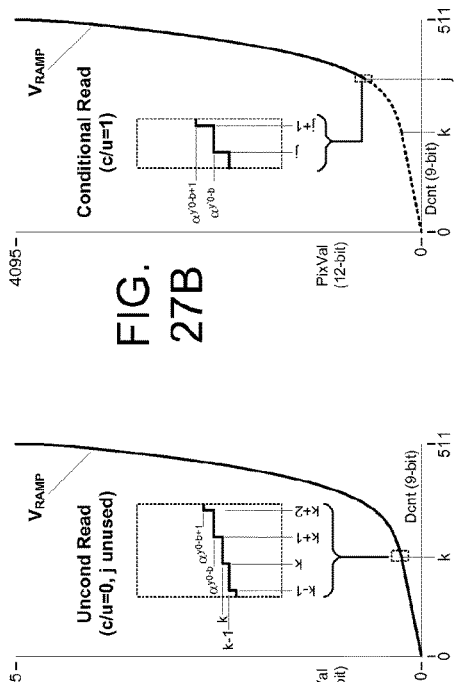

LOW-NOISE, HIGH DYNAMIC-RANGE IMAGE SENSOR

CROSS-REFERENCE TO RELATED APPLICATIONS

This application hereby claims priority to and incorporates by reference U.S. Provisional Application No. 62/029,392, filed Jul. 25, 2014 and entitled "LOW-NOISE, HIGH DYNAMIC-RANGE IMAGE SENSOR."

TECHNICAL FIELD

The present disclosure relates to the field of integrated-circuit image sensors.

BACKGROUND

Image data retrieval in modern integrated-circuit image sensors is generally executed as a two-phase "correlated double sampling" (CDS) operation with respect to four-transistor (4T) pixels. In the first phase, a floating diffusion node of the pixel being "read out" is reset to an initial condition and then sampled to obtain a measure of background noise. In the second phase, charge integrated within a photodiode component of the pixel (i.e., according to the number of photon strikes during a preceding exposure interval) is transferred to the floating diffusion node which is then sampled a second time to obtain a raw measure of the photodiode charge level. To finalize the pixel read-out, the reset sample is subtracted from the photocharge sample (canceling background noise common to both samples) with the difference supplied to an analog-to-digital converter (ADC) for digitization, thus producing a digital pixel value corresponding to the photocharge level less background noise.

While CDS pixel read-out significantly improves noise performance relative to non-correlated techniques, drawbacks remain. In particular, the integrated circuit body effect yields a photo response non-uniformity (PRNU) across the pixel array and thus a fixed pattern noise (FPN) that is becoming more pronounced as feature geometries shrink. More generally, as pixels shrink, it becomes difficult to reduce input referred noise and readout speed with conventional CDS techniques due to the limited conversion gain attainable to maintain reasonable TG feed-through and adequate output line settling time.

BRIEF DESCRIPTION OF THE DRAWINGS

The various embodiments disclosed herein are illustrated by way of example, and not by way of limitation, in the figures of the accompanying drawings and in which like reference numerals refer to similar elements and in which:

FIG. 1 illustrates embodiments of a 4T pixel, per-column readout circuit and analog-to-digital conversion (ADC) controller that enable in-pixel correlated double-sampling ADC operation;

FIG. 2 illustrates an exemplary sequence of operations carried out within the pixel, per-column readout circuit and global ADC controller of FIG. 1 to generate a digitized correlated-double-sampled readout value;

FIG. 3 illustrates exemplary in-pixel ADC voltage ramp profiles for ISO 100, ISO 200 and ISO 400 settings FIG. 4 illustrates control signal feedthrough that can occur during pixel read-out and the prolonged read-out interval that may result;

FIG. 5 illustrates excerpts of the 4T pixel, per-column read-out circuitry and global ADC controller of FIG. 1, with the per-column read-out circuitry modified to enable assertion of a nulling pulse on the column ramp line;

FIG. 6 illustrates the time multiplexing of a feedthrough nulling pulse and ADC voltage ramp on the column ramp line;

FIGS. 7A-D illustrate a common-source read-out configuration that may be deployed in combination with in-pixel ADC and feedthrough nulling circuitry, contrasting the higher conversion gain achievable in the common-source read-out configuration with a lower gain source-follower configuration;

FIG. 19 is an exemplary diagram of the electrostatic potential across device section A-A' of the conditional-read pixel embodiment of FIG. 18;

FIG. 20 is a timing diagram illustrating an exemplary pixel cycle diagram corresponding to the read-out masking pixel of FIG. 16, showing the five-phase operation discussed above;

FIG. 21 illustrates relative electrostatic states of the photodiode, transfer gate and floating diffusion during the charge-integration and read-out phases of pixel operation, contrasting pixels having conditionally-enabled transfer gates with read-out masking pixels having conditionally-shifted photodiode depletion potentials;

FIGS. 22A and 22B illustrate an alternative read-out sequence in which a column control line is maintained at 0 v during charge integration, raising the photodiode depletion potential relative to the read-out sequence of FIGS. 20 and 21;

FIG. 23 illustrates an exemplary pixel array showing two columns of read-out masking pixels and a column-spanning photodiode pinning layer;

FIGS. 24A-24C illustrate an alternative embodiment of an integrated-circuit imaging device in which all pixel read-out operations are executed unconditionally through concurrent assertion of transfer gate and pinning-voltage control signals;

FIG. 26 illustrates an alternative ADC arrangement in which a monotonic-ramp generator;

FIGS. 27A and 27B illustrate exemplary inverse-VLL profiles generated by VLL-encoding ramp signal generator of FIG. 26;

FIG. 28 illustrates an exemplary sequence of operations carried out by an image processor to program a VLL-encoding image sensor and recover full-resolution data from the image sensor output;

DETAILED DESCRIPTION

Figure 7B:
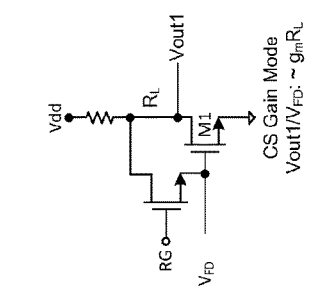

In various embodiments herein, a correlated double-sample (CDS) read-out is executed by sampling the reset potential of a floating diffusion node within a 4T pixel, transferring integrated photocharge from the photodiode to the floating diffusion node (thus lowering the floating diffusion potential in accordance with the level of integrated charge) and then iteratively adjusting the potential of a signal line capacitively coupled to the floating diffusion node until the floating diffusion potential is restored to the reset potential. By this operation, referred to herein as a pixel-coupled analog-to-digital conversion (ADC) or in-pixel ADC, a digital control value that yields the reset-matching floating diffusion potential may be latched as a digital representation of the correlated double sample, thereby effecting an analog-to-digital conversion. Because the ADC value (i.e., latched digital control value) is resolved at a floating diffusion potential that matches the reset potential, transistor threshold variations resulting from the body effect (and therefore PRNU) is substantially eliminated, thus significantly reducing fixed pattern noise across the pixel array. Similarly, because the two samples (i.e., reset sample and photocharge sample) are effectively captured at the same floating diffusion potential, the voltage range over which a stable/linear conversion gain is required is dramatically reduced (i.e., to a negligibly small voltage range), enabling application of substantially higher conversion gain during pixel read-out and thereby substantially reducing the input-referred noise that plagues conventional CDS read-out approaches. Further, because the amplified pixel signal is used directly by the ramp comparison instead of being sampled and held, the effective time between readout of a reset value and readout of a pixel signal value is reduced for low-light pixel signals, decreasing temporal noise for the low-light samples where temporal readout noise is of most concern.

In other embodiments, modified 4T pixel architectures are operated in a manner that enables a non-destructive charge-accumulation assessment, followed by a correlated double sampling (CDS) read-out if the assessment indicates a threshold level of photocharge has been accumulated. That is, instead of reading out the net level of charge accumulated within the photodiode (i.e., a pixel sampling operation) and conditionally resetting the photodiode based on that read-out (i.e., as in a 3T pixel sampling operation), a preliminary overthreshold sampling operation is executed to enable detection of an overthreshold state within the photodiode, with the full photodiode read-out (i.e., pixel sample generation) being conditionally executed according to the preliminary overthreshold detection result. In effect, instead of conditionally resetting the photodiode according to the pixel value obtained from full photodiode readout, full photodiode readout is conditioned on the result of a preliminary, non-destructive determination of whether the threshold has been exceeded; an approach enabled, in at least one embodiment, by dissociating the conditional-read threshold (i.e., used to assess the level of integrated charge) from the pixel value generation. The conditional CDS read-out itself may be executed in a variety of ways in respective sensor architectures, including the pixel-coupled ADC operation described briefly above. Also, in a number of embodiments, the ADC circuitry (including but not limited to pixel-coupled ADC) encodes a visually lossless lookup function to reduce ADC bit depth, and thus speeds ADC operation to a point that permits low noise, effective single-slope ADC architecture without limiting the pixel read-out rate or suffering the large circuit footprint/power-demand of successive approximation register (SAR) approaches.

Pixel-Coupled ADC

FIG. 1 illustrates embodiments of a 4T pixel 50, per-column readout circuit 51 and ADC controller 53 that enable the pixel-coupled, correlated double-sample ADC operation discussed briefly above. As shown, pixel 50 includes a photodiode 110 and floating diffusion 112 separated by a transfer gate 101, as well as a reset transistor 109, amplifier transistor 105 and read-select transistor 107. The source terminal of read-select transistor 107 is coupled to per-column readout circuit 51 via a pixel output line (Vout), and the floating diffusion 112 is capacitively coupled to per-column read-out circuit 51 via capacitive element 111 (Cadc) and column ramp line, $CV_{RMP}$. Note that the capacitive element 111 may be implemented by a purposefully formed capacitive structure, or by a parasitic capacitance effected, for example, by intentionally routing the column ramp line over or otherwise near floating diffusion node 112 and/or a metal line coupled directly to the FD node (e.g., $CV_{RMP}$ routed over a metal line connecting floating diffusion 112 to the gate of amplifier transistor 105 or a purpose-formed stub connection). Also, though not specifically shown, pixel 50 constitutes part of a larger integrated-circuit pixel array, sharing (i.e., being coupled in common to) the pixel output line and column ramp line with other pixels in the same pixel column, and sharing transfer gate, reset gate and read-select control signals (i.e., TG, RG and RS, coupled to transfer gate 101, reset transistor 109 and read-select transistor 107, respectively) with other pixels in the same pixel row. Further, floating diffusion node 112 and read-out/reset transistors (i.e., amplifier transistor 105, read-select transistor 107 and reset transistor 109) may be shared among multiple photodiode/transfer-gate pairs, thus mitigating (amortizing) the area penalty of the read-out/reset circuitry to reduce the average transistor count per pixel, and also to enable charge-binning (aggregation) among multiple pixels in reduced-spatial resolution read-out modes.

Still referring to FIG. 1, per-column readout circuit 51 includes a reset-state sample-and-hold (S/H) circuit 55 (i.e., formed by access transistor 56 and capacitor Crst), sense amplifier 59, ramp-line multiplexer 61, output latch 63, and current source 57 (formed by Vb-biased transistor 58 in the example shown). As its name implies, per-column readout circuit 51 is coupled to a single column of pixels (including pixel 50) via the pixel output and column ramp lines, with additional instances of the per-column readout circuit (not shown) provided for respective columns of pixels within the pixel array instances of the per-column. By contrast, global ADC controller 53 includes a counter 69 and ramp generator 67 that supply an ADC count value (Dcnt—also referred to herein as a "step count") and voltage-ramp signal ($V_{RAMP}$), respectively, to all per-column readout circuits in the image sensor.

FIG. 2 illustrates an exemplary sequence of operations carried out within the pixel, per-column readout circuit and global ADC controller of FIG. 1 to generate a digitized CDS readout value. In the particular implementation shown, the pixel is operated cyclically, being reset, exposed, noise-sampled, and read-out in respective operational phases, before those operations are repeated. In alternative embodiments discussed below, one or more additional operational phases may be included in the pixel cycle (e.g., threshold evaluation) and/or other operational phases omitted (e.g., pixel reset may be effected during read-out so that, after an initial "hard reset" the explicit reset phase may be omitted).

Referring to both FIGS. 1 and 2, during the initial "reset" phase of the pixel cycle (phase 1), the transfer-gate signal (TG) and reset-gate signal (RG) are raised concurrently, thus enabling photodiode 110 to become fully emptied of charge and floating diffusion 112 to be charged to a reset potential (e.g., Vdd less a threshold drop in the example shown). During the ensuing charge integration phase (or exposure phase), charge is accumulated/integrated within the photodiode in response to photon strikes (light impingement), thereby lowering the photodiode potential (for a pixel that collects photoelectrons, rather than holes) in accordance with ambient light intensity. Note that the boundaries of integration phase 2 correspond to the predominant portion of the photocharge integration interval. In actuality, photocharge is integrated within the photodiode starting from the low going transition of the transfer-gate signal (TG) to the next rising edge of that same signal as shown. Immediately following the charge integration phase (charge integration technically continues until TG is deasserted in phase 4) and at the start of the noise-sample phase, the read-select signal (RS) is raised to couple the output of amplifier 105 to the pixel output line (Vout) and thus ready the pixel for read-out operations. Shortly thereafter, the reset-gate signal is pulsed to restore the floating diffusion node to the reset state (note that the reset-gate signal may alternatively be held high during the integration phase to maintain the floating diffusion node in the reset state throughout the charge integration interval). At this point, a signal representative of the floating diffusion reset potential is driven onto the pixel output line (Vout) via amplifier transistor 105 and read-select transistor 107 and thus appears at the input of sample-and-hold circuit 55. Accordingly, when reset-state sample/hold signal (SHR) is pulsed (switching transistor 56 on and then off), the reset-state of the floating diffusion (i.e., noise sample) is captured within capacitive element Crst and thus appears at an input of sense amplifier 59.

After acquiring the reset (noise) sample, the photocharge transfer/ADC phase (also referred to herein as the digitization phase) of the pixel cycle commences, starting with pulsing the transfer-gate signal at 72 to transfer the charge integrated within photodiode 110 to floating diffusion node 112, thus causing the floating diffusion voltage to drop to an extent corresponding to the level of charge integration. That is, in low-light conditions the relatively small level of integrated charge will yield a correspondingly small drop in the floating diffusion potential, $V_{FD}$ (i.e., as shown by the dashed low-light $V_{FD}$ signal), while in brighter light conditions, the higher level of integrated charge will produce a correspondingly larger drop in $V_{FD}$ as shown. Note that the read-select signal remains high during and after the photocharge transfer operation, so that a signal representative of the post-charge-transfer floating diffusion potential is driven onto the pixel output line and thus appears at the second input of sense amplifier 59. In one embodiment, sense amplifier 59 is implemented as an asymmetric latching circuit that remains in a latched, logic-high output state until armed (e.g., by a sense-enable signal not shown) and thereafter generates a non-latched logic low output, $S_{OUT}$, so long as the pixel output signal (i.e., corresponding to $V_{FD}$) remains lower than the reset-state of the floating diffusion (i.e., as captured within sample-and-hold circuit 55 and applied to the other input of sense amplifier 59), re-latching $S_{OUT}$ at the logic-high state when the pixel output signal reaches or exceeds the reset-state sample. As shown, the sense amp output is supplied to ramp-line multiplexer 61 so that the column ramp line ($CV_{RMP}$) remains grounded until the sense amplifier is armed, switching over when the sense amp is armed (i.e., as $S_{OUT}$ goes low) to conduct the voltage ramp signal, VRAMP, to capacitive element 111.

In one embodiment, the ramp generator 67 is implemented as a linear digital-to-analog converter (DAC) that generates an analog voltage ramp signal in proportion to the step count value (Dcnt) from counter 69. Accordingly, by enabling counter 69 to begin counting shortly after sense amplifier is armed 59, a steadily increasing (i.e., ramping) voltage ramp potential is driven onto the column ramp line (i.e., as shown by the $V_{RAMP}$ waveform in FIG. 2), raising the potential on one side of capacitive element 111 and, because floating diffusion node 112 is isolated (i.e., floating), correspondingly raising (ramping) the potential of floating diffusion node 112. As shown at 73 with respect to the low-light $V_{FD}$ waveform, and at 74 with respect to the brighter light $V_{FD}$ waveform, the ramping $V_{FD}$ potential is eventually raised (restored) to the reset-state potential, at which point the sense amplifier output ($S_{OUT}$) goes high, latching the step count value (Dcnt) that yielded the reset-matching floating diffusion potential within data output latch 63. That is, by incrementally ramping the floating diffusion potential from a starting point that corresponds to the integrated charge level to an ending point that corresponds to the reset-state potential, a digitized measure of the integrated photocharge level is obtained (i.e., an analog-to-digital conversion is effected), with the final determination of the digital output occurring at nominally the same floating diffusion potential as the reset-state sample. Thus, instead of capturing separate analog samples of the floating diffusion reset state and post-charge-transfer "signal" state within per-column readout circuit (e.g., within respective sample-and-hold elements) and then generating an ADC output based on the difference between those analog samples, an ADC output is generated by capacitively raising the floating diffusion potential from the signal-state to the prior-sampled reset-state and generating a digital measure of the voltage level needed to bridge those potentials. Because the reset-state sample and final ADC determination are achieved at the same or nearly the same floating diffusion potential, the PRNU that plagues conventional approaches (i.e., due to variations in body-effect that arise from measurements of different potentials at the gate and subsequently the source of amplifier transistor 105) is virtually eliminated. Further, as discussed below, the uniformity (or near uniformity) between the floating diffusion potential during reset-state sample and ADC finalization dramatically shrinks the voltage range over which a stable (linear) conversion gain is required (i.e., to near zero), permitting substantially higher conversion gains than achievable using conventional source-follower output circuits.

Still referring to FIGS. 1 and 2, while step counter 69 is shown as supplying the Dcnt value to both column latches 63 (only one of which is shown) and ramp generator 67, the Dcnt value may alternatively be scaled prior to being supplied to ramp generator 67, for example, to emulate different ISO responses. Alternately, a scale factor may be implemented within the ramp generator itself, for example, by scaling one or more reference voltages applied within a digital-to-analog converter (DAC) within ramp generator, or selecting a different set of reference voltages. FIG. 3 illustrates this effect in exemplary in-pixel ADC voltage ramp profiles for ISO 100 (also referred to herein as a "base ISO"), ISO 200 and ISO 400 settings. Additional and/or different (e.g., higher resolution) ISO settings may be implemented in alternative embodiments.

Mitigating Control Signal Feedthrough

FIG. 4 illustrates a capacitive feedthrough phenomenon that tends to prolong the CDS readout interval and, consequently, increase temporal noise and constrain pixel readout conversion gain. The feedthrough effect on the VFD signal line was not shown in FIG. 2 for the in order to simplify the initial discussion and explanation. More specifically, control signal pulses, particularly on the reset-gate and transfer-gate control lines, tend to capacitively couple (i.e., feedthrough) to the floating diffusion node of the pixel, creating feedthrough pulses as shown at 75a and 75b. Accordingly, to limit feedthrough noise, a settling delay following these pulses is generally imposed between the reset-gate pulse and reset-state sample-and-hold pulse SHR (i.e., to provide time for the feedthrough pulse to dissipate), and an even longer delay is generally imposed between the transfer-gate pulse (TG) and signal-state measurement (i.e., whether achieved by sampling the signal state through assertion of an signal-state sample-and-hold pulse SHS, or by driving a $V_{RAMP}$ signal onto a column ramp line as in the in-pixel ADC arrangement discussed above), both of which extend the overall CDS read-out interval. Unfortunately, capacitive feedthrough is worsening as process geometries shrink and also becomes more pronounced at higher conversion gain, limiting the magnitude of conventional conversion gains and thus limiting the ability to reduce input referred noise.

In one embodiment, shown at in the timing diagram at 77 in FIG. 4, a feedthrough-mitigating nulling pulse is asserted on a row based signal line and/or respective column based signal lines (shown generally as "Null") that extend in proximity to the floating diffusions within a selected respective row or column of pixels (there being at least one such "nulling" line for each pixel row and/or each pixel column in at least one embodiment). The nulling pulse counteracts capacitive feed-through resulting from application of the TG pulse during the photocharge sampling phase, thus reducing the output line settling time and thereby reducing CDS time and corresponding temporal noise during the signal-state sampling operation or in-pixel ADC operation. Although not specifically shown in FIG. 4, a nulling pulse may additionally be generated in coordination with other control signal pulses (e.g., during TG pulse generation in an overthreshold detection phase as discussed below, concurrently with the RG pulse at the start of the noise sampling operation, etc.).

Also, while the nulling pulse is shown as transitioning from 0 v to a negative voltage, a low-going pulse that transitions from a positive to a negative voltage, or even from a positive voltage to a less positive voltage may alternatively be applied. More generally, nulling pulses may be generated at appropriate times and with appropriate amplitudes and polarities to counteract any control signal feed-through including, for example and without limitation, feed-through from the read-select signal assertion (RS), reset-gate signal assertion (RG) as well as various other row and column control signals discussed below.

FIG. 5 illustrates excerpts of the 4T pixel, per-column read-out circuitry and global ADC controller of FIG. 1, but having a modified ramp line multiplexer 81 that enables nulling pulse assertion on the column ramp line, $CV_{RMP}$. That is, the column ramp line is time-multiplexed to convey one or more nulling pulses that counteract control signal feedthrough (e.g., TG, RG, etc.) during the initial phases of the pixel cycle, and then to convey the ramp voltage in connection with the in-pixel ADC operation discussed above. FIG. 6 illustrates this time-multiplexed operation, showing assertion of a low-going nulling pulse on the column ramp line (i.e., driving $CV_{RMP}$ to $V_{NULL}$) concurrently with the transfer gate pulse during the photocharge sampling phase, and thereafter driving the voltage ramp signal up until the point when the sense amp raises the $S_{OUT}$ signal (indicating that the floating diffusion reset potential has been reached). As shown in exemplary truth table 83 of FIG. 5, ramp line multiplexer 81 enables the column ramp line to be driven at different times by the output of ramp generator 67 (i.e., $V_{RAMP}$), a null voltage source ($V_{NULL}$), or a ground reference source (0 v), depending on the state of the sense amplifier output ($S_{OUT}$) and a null-enable signal (EnNull).

Figure 7C:
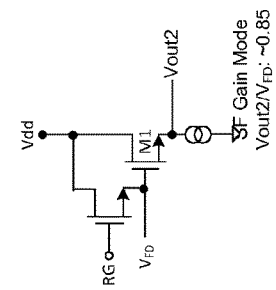
Figure 7A:
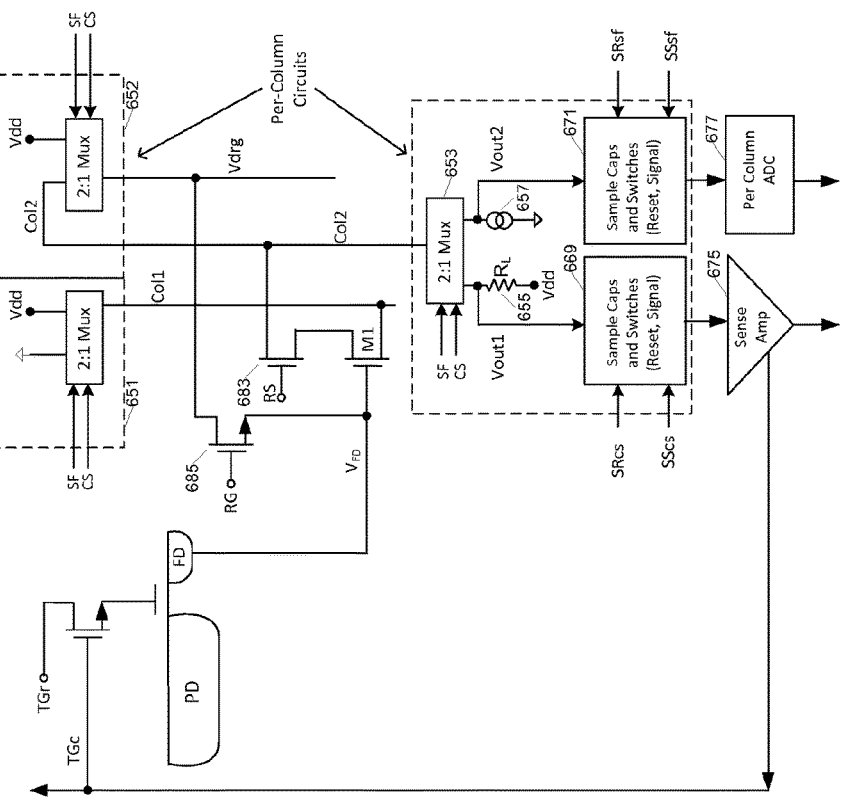

When employed in tandem as shown in FIGS. 4-6, in-pixel ADC operation and feedthrough nulling alleviate noise and gain stability concerns that have traditionally limited pixel conversion gain, enabling deployment of higher conversion gain pixel structures and higher gain for the in-pixel read-out circuitry. For example, as shown in FIGS. 7A-7D, a common-source read-out configuration may be used to complete a CDS read-out operation instead of a more conventional, and much lower gain, source-follower configuration (also shown, for purposes of contrast). The source follower configuration corresponds to the arrangement shown in FIG. 1, and generally achieves a gain slightly below unity (i.e., as the Vout node follows the potential of the floating diffusion so as to maintain the relatively constant gate-to-source voltage enforced by the current source (e.g., transistor 58 coupled in a common-source arrangement). By contrast, in the common source configuration, the pixel output is proportional to the transconductance of the amplifier transistor, multiplied by the load resistance (in the case of FIG. 7A implemented by load resistor RL, and in the case of FIG. 7D implemented by VDD-coupled and $V_{load}$-biased transistor 58), and therefore may be substantially greater than one (note also that reset gate 109 switchably couples floating diffusion node 112 to the Vout line instead of Vdd, thereby effecting a feedback-controlled floating-diffusion reset potential that avoids overdriving the common source amplifier during reset-state sampling). In one embodiment as shown in FIG. 7A-7C, a combination common source amplifier and source amplifier configuration can be implemented for a flexible pixel based amplifier readout. Referring to FIG. 7A, signals CS and SF are used to multiplex the load, source of the amplifier transistor and drain of the reset transistor to appropriate per column nodes. FIGS. 7B and 7C show the resulting effective circuit configurations for the selection of common source and source follower respectively. FIG. 7D shows a simplified schematic for both the source follower and common source amplifier configurations for the in pixel ADC architecture. In a number of embodiments, for example, the common source amplifier configuration is tuned to yield a conversion gain of roughly 3 to 5 (though higher or lower gains may be applied), thus substantially reducing input referred noise relative to the lower-gain source follower configuration.

High-SNR Image Sensor with Non-Destructive Threshold Monitoring

Figure 8:
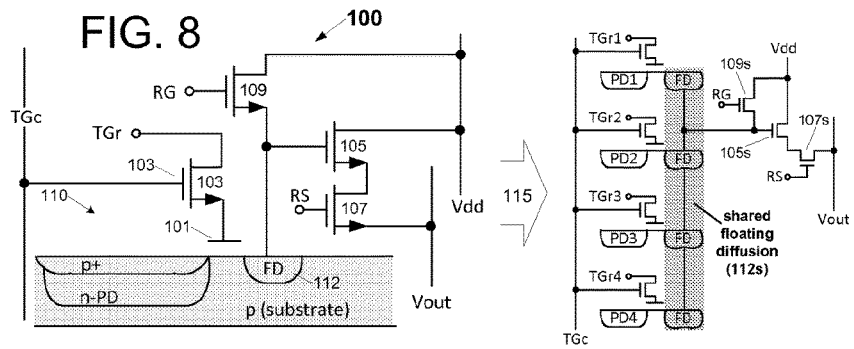
FIG. 8 illustrates an embodiment of a modified 4-transistor pixel in which a non-destructive overthreshold detection operation is executed to enable conditional-read operation in conjunction with correlated double sampling.

FIG. 8 illustrates an embodiment of a modified 4T pixel 100, referred to herein as a "conditional-read pixel," in which a non-destructive overthreshold detection operation is executed to enable conditional-read/reset operation in conjunction with correlated double sampling. As explained more fully below, the overthreshold detection involves a limited read-out of the photodiode state which, when determined to indicate an overthreshold condition, will trigger a complete read-out of the photodiode state. That is, pixel 100 is read-out in a progression from a limited overthreshold detection read-out to a complete read-out (the latter being conditional according to the overthreshold detection result).

Still referring to FIG. 8, conditional-read pixel 100 includes a transfer gate 101 disposed between a photodiode 110 (or any other practicable photosensitive element) and floating diffusion node 112, and a transfer-enable transistor 103 coupled between a transfer-gate row line (TGr) and transfer gate 101. The gate of transfer-enable transistor 103 is coupled to a transfer-gate column line (TGc) so that, when TGc is activated, the potential on TGr is applied (minus any transistor threshold) via transfer-enable transistor 103 to the gate of transfer-gate 101, thus enabling charge accumulated within photodiode 110 to be transferred to floating diffusion 112 and sensed by the pixel readout circuitry. More specifically, floating diffusion 112 is coupled to the gate of source follower 105 (an amplification and/or charge-to-voltage conversion element), which is itself coupled between a supply rail ($V_{DD}$ in this example) and a read-out line, Vout, to enable a signal representative of the floating diffusion potential to be output to read-out circuits outside of the pixel.

As shown, a row-select transistor 107 is coupled between the source follower 105 and the read-out line (Vout) to enable multiplexed access to the read-out line by respective rows of pixels. That is, row-select lines ("RS") are coupled to the control inputs of row-select transistors 107 within respective rows of pixels and operated on a one-hot basis to select one row of pixels for sense/read-out operations at a time. A reset transistor 109 is also provided within the pixel to enable the floating diffusion to be switchably coupled to the supply rail (i.e., when a reset-gate line (RG) is activated) and thus reset. The photodiode itself may be reset along with the floating diffusion by fully switching on transfer gate 101 (e.g., by asserting TGc while TGr is high) and reset transistor 109 concurrently, or by merely connecting the photodiode to a reset-state floating diffusion. Note that in an alternate embodiment, the common-source output configuration of FIG. 7 can be substituted for the source-follower portion of pixel 100.

Still referring to FIG. 8, a single floating diffusion node and corresponding read-out/reset circuitry (i.e., transistors 105, 107, 109) may be shared by two or more pixels, thus reducing the per-pixel transistor count and enabling charge-binned (reduced spatial resolution) imaging modes. As shown in detail view 115, for example, a single floating diffusion node 112s is shared by a column of four pixels (denoted by respective photodiodes PD1-PD4), as is readout circuitry formed by amplifier transistor 105s and read-select transistor 107s and reset transistor 109s. In this particular configuration (various others are possible, including configurations that span two or more columns of pixels), four pixels are implemented by a total of seven transistors (four of which are transfer gates), thus effecting an average transistor count of 1.75 (i.e., "1.75T") per pixel.

Figure 9:
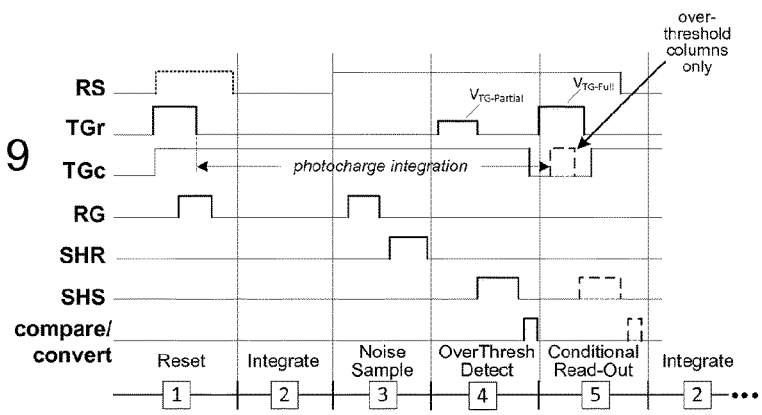
FIG. 9 is a timing diagram illustrating an exemplary pixel cycle within the progressive read-out pixel of FIG. 8.

FIG. 9 is a timing diagram illustrating an exemplary pixel cycle within the conditional-read pixel of FIG. 8. As shown, the pixel cycle is split into five intervals or phases corresponding to distinct operations executed to conditionally read out or refrain from reading out the pixel state. In the first phase (phase 1), a reset operation is executed within the photodiode and floating diffusion by concurrently asserting the appropriate logic high signals on the TGr, TGc and RG lines to switch on transfer-enable transistor 103, transfer gate 101 and reset transistor 109, thereby switchably coupling photodiode 110 to the supply rail via transfer gate 101, floating diffusion 112 and reset transistor 109 (the illustrated sequence can begin with an unconditional reset (e.g., at the start of a frame interval), and can also begin from a preceding conditional read-out/reset operation). To conclude the reset operation, the TGr and RG signals (i.e., signals applied on like-named signal lines) are lowered to appropriate "off" levels, thereby switching off transfer gate 101 (and reset transistor 109) so that the photodiode is enabled to accumulate (or integrate) charge in response to incident light in the ensuing integration phase (phase 2). Lastly, although the row-select signal goes high during the reset operation shown in FIG. 9, this is merely a consequence of an implementation-specific row decoder that raises the row-select signal whenever a given row address is decoded in connection with a row-specific operation (e.g., raising the TGr and RG signals during reset directed to a given row). In an alternative embodiment, the row decoder may include logic to suppress assertion of the row-select signal during reset as indicated by the dashed RS pulse in FIG. 9.

At the conclusion of the integration phase, the floating diffusion is reset (i.e., by pulsing the RG signal to couple the floating diffusion to the supply rail) and then sampled by a sample-and-hold element within the column read-out circuit. The reset and sample operation (shown as phase 3 in FIG. 9), in effect, samples the reset level of the floating diffusion and is executed in the embodiment of FIGS. 8 and 9 by asserting the row-select signal (RS) for the pixel row of interest while pulsing a reset-state sample-and-hold signal (SHR) to convey the state of the floating diffusion to the sample-and-hold element (e.g., a switch-accessed capacitive element) within the column read-out circuit via read-out line, Vout.

Figure 10:
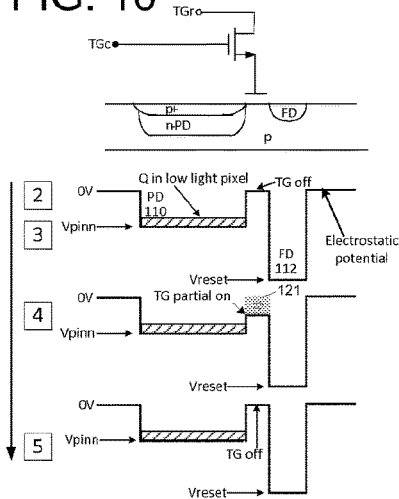
FIGS. 10 and 11 illustrate exemplary electrostatic potential diagrams for the photodiode, transfer gate and floating diffusion of FIG. 8 below their corresponding schematic cross-section diagrams.
Figure 11:
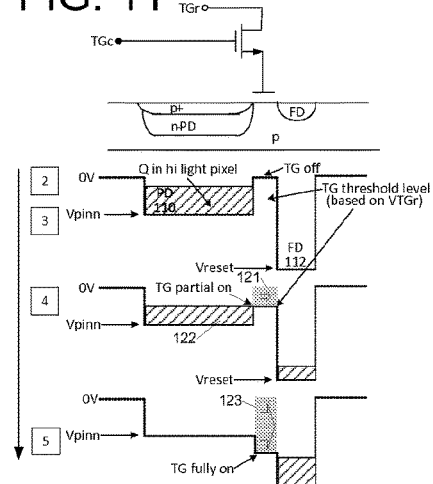

After acquiring the reset sample in phase 3, an overthreshold detection operation is executed in phase 4 by raising the TGr line to a partially-on, "overthreshold-detection" potential, $V_{TG\text{-}Partial}$, concurrently with switching on transfer-enable transistor 103 (i.e., by asserting a logic high TGc signal, although in this embodiment TGc is already on). By this operation, $V_{TG\text{-}Partial}$ is applied to transfer gate 101 to switch the transfer gate to a "partial on" state ("TG partial on"). Referring to FIGS. 10 and 11, electrostatic potential diagrams for photodiode 110 (a pinned photodiode in this example), transfer gate 101 and floating diffusion 112 are shown below their corresponding schematic cross-section diagrams. Note that the depicted levels of electrostatic potential are not intended to be an accurate representation of the levels produced in an actual or simulated device, but rather a general (or conceptual) representation to illustrate the operation of the pixel read-out phases. Upon application of $V_{TG\text{-}Partial}$ to transfer gate 101, a relatively shallow channel potential 121 is formed between photodiode 110 and floating diffusion 112.

In the example of FIG. 10, the level of charge accumulated within the photodiode at the time of the overthreshold detection operation (phase 4) does not rise to the threshold level required for charge to spill over (i.e., be transferred) to the floating diffusion via the shallow channel potential of the partially-on transfer gate. Accordingly, because the accumulated charge level does not exceed the transfer threshold (or spillover threshold) established by application of $V_{TG\text{-}partial}$ to the control node of transfer gate 101, there is no charge transfer from the photodiode to the floating diffusion and the accumulated charge instead remains undisturbed within the photodiode. By contrast, in the example of FIG. 11, the higher level of accumulated charge does exceed the transfer threshold so that a portion of the accumulated charge (i.e., that subset of charge carriers that are above the transfer gate partially-on electrostatic potential) spills over into floating diffusion node 112, with the residual accumulated charge remaining within the photodiode as shown at 122.

Still referring to FIGS. 9, 10 and 11, prior to conclusion of overthreshold detection phase 4, the charge level of the floating diffusion is sampled and held within a signal-state sample-and-hold element (i.e., in response to assertion of signal SHS) to yield a threshold-test sample—the difference between the signal-state sample and the previously obtained reset-state sample—to be evaluated with respect to a conditional-reset threshold. In one embodiment, the conditional-reset threshold is an analog threshold (e.g., to be compared with the threshold-test sample in a sense amplifier in response to assertion of a compare/convert strobe signal) set or programmed to a setting above the sampling noise floor, but low enough to enable detection of minute charge spillover via the shallow transfer gate channel. Alternatively, the threshold-test sample may be digitized in response to assertion of the compare/convert signal (e.g., within an analog-to-digital converter that is also used to generate the finalized pixel sample value) and then compared with a digital conditional-reset threshold, again, set (or programmed to a setting) above the noise floor, but low enough to enable detection of trace charge spillover. In either case, if the threshold-test sample indicates that no detectable spillover occurred (i.e., threshold-test sample value is less than conditional-reset spillover threshold), then the photodiode is deemed to be in the underthreshold state shown in FIG. 10 and the TGc line is held low in the ensuing conditional read-out phase (phase 5, the final phase) to disable transfer gate 101 for the remainder of the conditional read-out operation—in effect, disabling further read-out from the photodiode and thus enabling the photodiode to continue integrating charge without disruption for at least another sampling interval. By contrast, if the threshold-test sample indicates a spillover event (i.e., threshold-test sample greater than conditional-reset/transfer threshold), then the TGc line is pulsed high, (or alternately remains high) during the conditional read-out phase concurrently with application of a fully-on, "remainder-transfer" potential, $V_{TG\text{-}Full}$, to the TGr line, thereby enabling the remainder of the charge (i.e., charge 122 as shown in FIG. 11) within photodiode 110 to be transferred to floating diffusion 112 via the full-depth transfer-gate channel (123) so that, between the overthreshold transfer in phase 4 and the remainder transfer in phase 5, the charge accumulated within the photodiode since the hard reset in phase 1 is fully transferred to the floating diffusion where it may be sensed in a pixel read-out operation. In the embodiment shown, the pixel-readout operation is effected by pulsing the SHS signal and compare/convert strobe in sequence during conditional read-out phase 5, though either or both of those pulses may optionally be suppressed in absence of an overthreshold detection. Note that conditional read-out of the photodiode (i.e., effected by asserting TGc in conjunction with application of $V_{TG\text{-}Full}$ on TGr) effectively resets the photodiode (i.e., drawing off all charge to the floating diffusion), while suppression of the conditional read-out leaves the integration state of the photodiode undisturbed. Accordingly, execution of the conditional read-out operation in phase 5 conditionally resets the photodiode in preparation for integration anew in the succeeding sampling interval (i.e., the succeeding "subframe interval" or "subframe" for short) or refrains from resetting the photodiode to enable cumulative integration in the subsequent sampling interval. Thus, in either case, a new integration phase follows phase 5, with phases 2-5 being repeated for each subframe of the overall frame (or exposure) interval, before repeating the hard reset in a new frame. In other embodiments, where cumulative integration is permitted across frame boundaries, the hard reset operation may be executed to initialize the image sensor and omitted for an indeterminate period of time thereafter. Also, instead of the hard reset operation shown in phase 1, an unconditional read/reset may be effected following the final subframe of a frame interval or, if desired, in any non-final subframe by unconditionally asserting TGc during read-out phase 5 (i.e., asserting TGc in phase 5 without regard to the result of the overthreshold detection in phase 4.

Conditional-Read Pixel with Pixel-Coupled ADC Read-out

Figure 13:
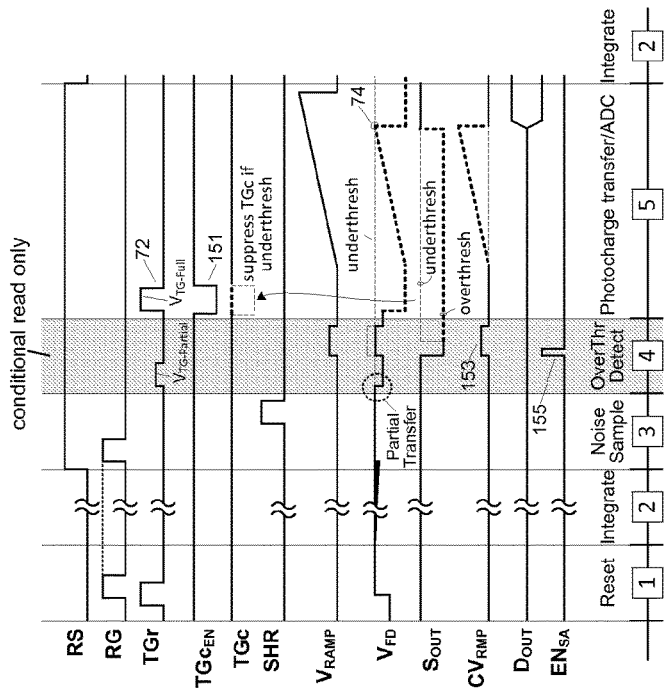
FIGS. 12 and 13 illustrate a pixel architecture and per-column read-out logic and a corresponding timing diagram that merge the in-pixel ADC operation described in reference to FIGS. 1-7 with the conditional-read pixel operation described in reference to FIGS. 8-11.
Figure 12:
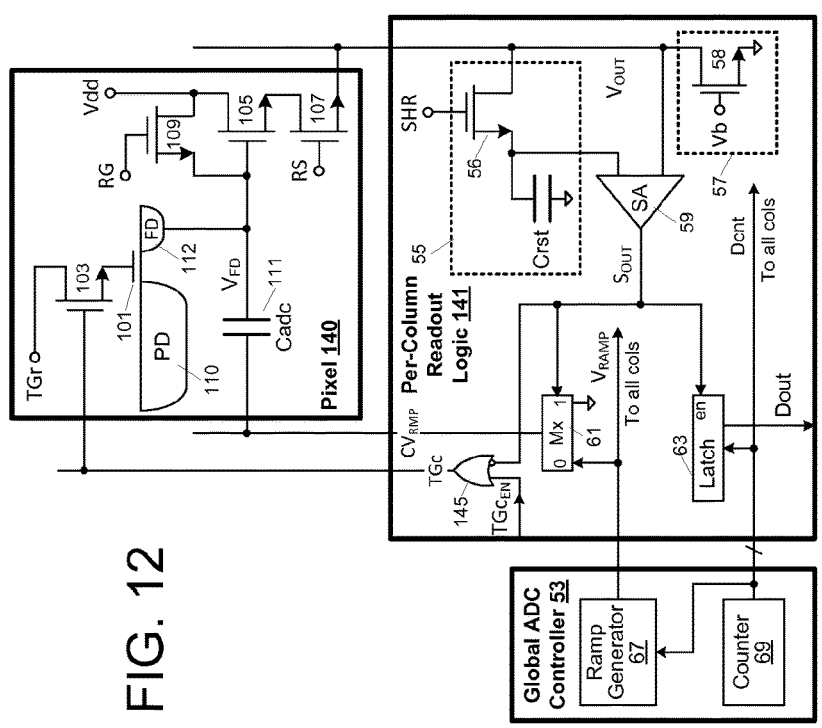

FIGS. 12 and 13 illustrate a pixel architecture and per-column read-out circuit that merge the in-pixel ADC operation described in reference to FIGS. 1-7 with the conditional-read pixel operation described in reference to FIGS. 8-11. Referring first to FIG. 12, pixel 140 is implemented generally as described in reference to FIG. 8 (i.e., including the photodiode 110, floating diffusion 112, transfer-enable transistor 103, transfer gate 101, amplifier transistor 105, read-select transistor 107 and reset transistor 109 all connected as described above), but is traversed by a $CV_{RMP}$ line capacitively coupled to the floating diffusion by capacitive element 111 (Cadc). Accordingly, as discussed in reference to FIGS. 1-7, the voltage level of floating diffusion 112 may be adjusted by per-column readout circuit 141 through application of a pulsed or ramped potential on the $CV_{RMP}$ line, thus permitting a determination of the floating diffusion voltage ($V_{FD}$) by enabling a signal representative thereof to be driven onto the pixel output line ($V_{OUT}$) via transistors 105 and 107 and compared (i.e., within sense amplifier 59 after arming by $EN_{SA}$ pulse 155) against a reset state sample captured within S/H element 55. Further, for purposes of overthreshold detection, a partial transfer may be enabled as discussed in reference to FIGS. 8-11, and the $CV_{RMP}$ line temporarily raised (i.e., pulsed as shown at 153 in FIG. 13) to a level corresponding to a threshold floating diffusion state while a signal representative of $V_{FD}$ is driven onto the pixel output line and compared (within sense amp 59) with the reset-state sample latched within sample and hold element to effect an under/overthreshold determination. More specifically, if the $CV_{RMP}$ pulse raises $V_{FD}$ above the reset state potential (i.e., sense amplifier 59 raises $S_{OUT}$), then a below-threshold level of photocharge transfer occurred in the partial transfer operation and the pixel is deemed to be in an underthreshold state. Conversely, if the $CV_{RMP}$ pulse fails to raise $V_{FD}$ above the reset-state potential (i.e., $S_{OUT}$ remains low), then an above-threshold level of photocharge transfer occurred in the partial transfer operation and the pixel is deemed to be in an overthreshold state.

If operated in conditional read mode (as discussed, conditional-read operation may be overridden to force an "unconditional read"), detection of an overthreshold condition results in a full photocharge transfer operation and in-pixel ADC operation to determine the voltage of the complete charge transfer. In the embodiment shown, for example, the output of sense amplifier 59 ($S_{OUT}$) is supplied to an inverting input of a logic OR gate 145 used to generate the TGc signal and a column enable signal, $TGc_{EN}$, is supplied to a non-inverting input of OR gate 145. As shown in FIG. 13, $TGc_{EN}$ is generally held high, and temporarily lowered at time 151 (i.e., during the photocharge transfer phase) so that the state of $S_{OUT}$ resulting from the overthreshold detection operation controls whether or not a full photocharge transfer operation is carried out, thus effecting a conditional photocharge transfer with respect to pixel 140. More specifically, if $S_{OUT}$ is high (signaling an underthreshold condition), then TGc will be driven low when $TGc_{EN}$ pulses low so that transfer-enable transistor 103 will remain off while TGr is driven to $V_{TG-Full}$. Accordingly, when an underthreshold condition is detected during a conditional read operation, transfer gate 101 will remain in a disabled (non-conducting state), preventing photocharge transfer from photodiode 110 to floating diffusion 112, and thus permitting cumulative photocharge integration across two or more pixel cycles. By contrast, if $S_{OUT}$ remains low following the partial charge transfer (i.e., signaling an overthreshold condition), then TGc will remain high during the low-going $TGc_{EN}$ pulse, maintaining transfer-enable transistor in a conducting state so that the VTG-Full pulse on the TGr line is applied to transfer gate 101. Accordingly, when an overthreshold condition is detected during the conditional read operation, photocharge is transferred fully from photodiode 110 to floating diffusion 112 to permit an in-pixel ADC readout to be carried out. This operation is executed generally as described above in reference to FIGS. 1-6, with ramp multiplexer 61 selecting the output of ramp generator 67 to drive a voltage ramp onto the $CV_{RMP}$ line and thereby capacitively ramp the floating diffusion voltage until the floating diffusion reset-state voltage level is reached. When $V_{FD}$ reaches (or exceeds) the reset-state voltage level (shown at 74), sense amplifier 59 raises $S_{OUT}$ to latch the current data count (ramp step count) within latch 63, thus capturing, as the analog to digital conversion result, a digital value corresponding to the charge integrated within the photodiode. Note that, while not specifically shown, additional logic may be provided within per-column read-out logic 141 to ensure that latch 63 is enabled only during the photocharge transfer phase (e.g., suppressing any latching operation if $S_{OUT}$ goes high during the overthreshold detection phase) and/or to suppress ramping of the $CV_{RMP}$ line if underthreshold condition is detected. Similarly, though not shown, control pulse nulling circuitry and/or common-source readout circuitry may be provided generally as described above in reference to FIGS. 4-7. Note that although employed to reduce feed-through from TG operations, a TG null signal is not shown in the timing diagram of FIG. 13.

Split-Gate Architecture

Figure 14:
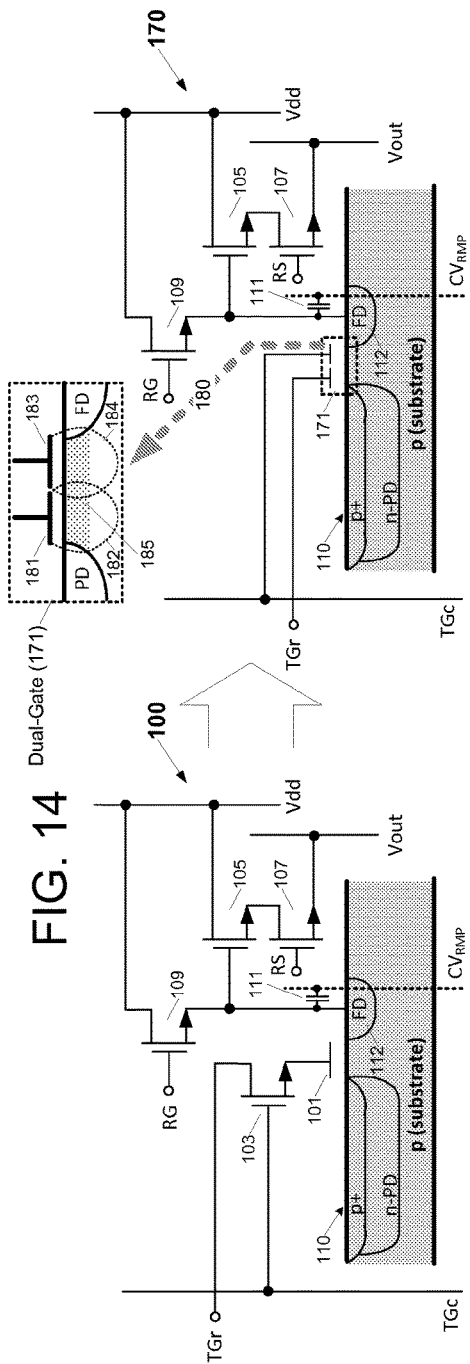
FIG. 14 contrasts embodiments of the conditional-read pixel of FIG. 8 and a "split-gate" conditional-read pixel.

FIG. 14 contrasts embodiments of the conditional-reset pixel 100 of FIG. 8 and a modified pixel architecture 170, referred to herein as "split-gate" conditional-reset pixel or split-gate pixel. In the embodiment shown, split-gate pixel 170 includes a photodiode 110 together with the same floating diffusion 112, reset transistor 109, source-follower 105, and row-select transistor 107 as pixel 100, but omits transfer-enable transistor 103 and single-control transfer-gate 101 in favor of a split, dual-control transfer-gate 171. Referring to detail view 180, dual-control transfer gate (or "dual-gate") includes distinct (separate) row and column transfer gate elements 181 and 183 disposed adjacent one another between photodetector 110 (PD) and floating diffusion 112 (FD). The row and column transfer gate elements (181 and 183) are coupled to row and column control lines, respectively, to receive row and column control signals, TGr and TGc and thus are independently (separately) controlled. Also, an optional $CV_{RMP}$ line may be routed column-wise across the pixel as shown to effect a capacitive coupling 111 with respect to floating diffusion node 112 and thus enable the in-pixel ADC operation discussed above.

In one split-gate pixel embodiment, the source/drain implant ordinarily required between series-coupled transistors (and thus between adjacent gate terminals) is omitted, thereby enabling the row and column transfer gate elements to be disposed closely enough to form a continuous enhancement channel 185 when both TGr and TGc are asserted, (at a signal level to provide charge transfer), while maintaining an ability to interrupt the channel when either of TGr and TGc is deasserted, (at a signal level to prevent charge transfer). In other embodiments, discussed in greater detail below, one or both of the row and column transfer gates may be entrenched within the substrate between the photodiode and floating diffusion, thereby enabling split-gate implementation with improved fill factor. In all of these split-gate pixel embodiments, the logic-AND function effected by the combined operation of transfer-gate 101 and transfer-enable transistor 103 in pixel 100 may be achieved within the substantially more compact dual-control gate 171, reducing the pixel footprint (i.e., die area consumption) by a transistor or a significant portion of a transistor relative to pixel 100. In the case of a quad pixel layout, for example, the dual-gate arrangement lowers the per-pixel transistor count from 2.75T (i.e., when pixel 100 is employed) to approximately 1.75T to 2T, depending on the dual-gate implementation. In addition to the reduced pixel footprint, the dual-gate design permits a negative potential, $V_{TG-Neg}$, to be applied to the transfer gate or transfer gates during the charge-integration (light accumulation) thereby improving sensor SNR by reducing subthreshold leakage from photodiode 110 transfer gate dark current, a function not readily available in embodiment 100 as a negative TGr voltage may disruptively forward-bias the source/drain to substrate diodes in transfer-enable transistor 103. Further, in contrast to the floating potential that results at transfer gate 101 of pixel 100 whenever TGc is lowered, row and column transfer gate elements 181 and 183 are continuously coupled to signal driving sources and thus may be continuously driven to the driver output voltage (i.e., not floating), potentially reducing noise in the pixel read-out operation.

Figure 15:
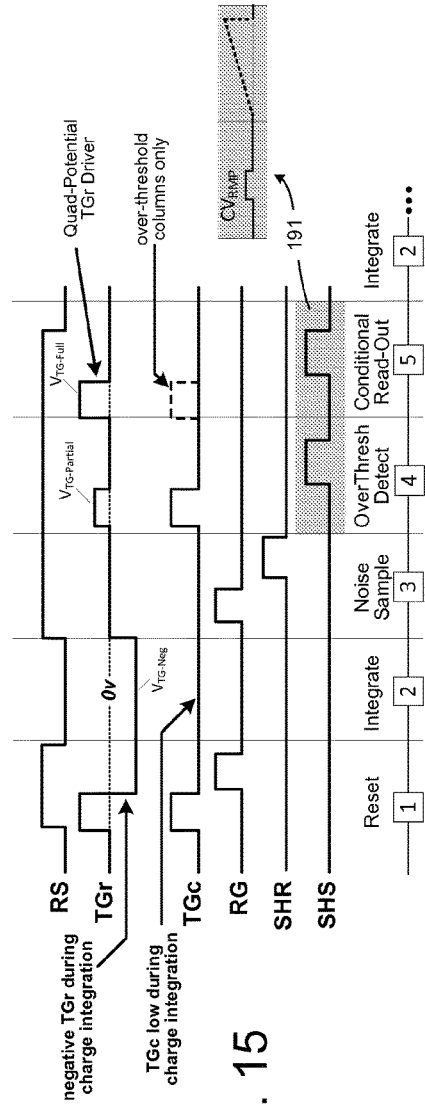
FIG. 15 is a timing diagram illustrating an exemplary pixel cycle (reset/charge integration/read-out) within the split-gate pixel of FIG. 14.

FIG. 15 illustrates an exemplary pixel cycle (reset/charge integration/read-out) within the split-gate conditional-read pixel embodiment of FIG. 14. As with the conditional-read pixel discussed in reference to FIGS. 8-13, the operational cycle of split-gate pixel 170 is split into five intervals or phases corresponding to distinct operations carried out to yield an eventual conditional readout (also, as with the conditional-read pixel of FIG. 8, split-gate pixel 170 can be read out unconditionally by skipping phase 4 or disregarding an underthreshold condition detected in that phase). Referring to both FIG. 15 and split-gate pixel 170 in FIG. 14, a reset operation is executed within the photodiode and floating diffusion in phase one by concurrently raising the TGr and TGc signals to establish a sufficiently deep channel potential between photodiode 110 and floating diffusion 112 (i.e., as shown at 185 in FIG. 14), and thereby reset the photodiode by enabling all of the residual or accumulated charge within the photodiode to be transferred to the floating diffusion. After (or concurrently with) the charge transfer operation, the reset-gate signal (RG) is pulsed to switch on reset transistor 109 and thus evacuate/empty charge from the floating diffusion by switchably coupling the floating diffusion to $V_{dd}$ or other supply voltage rail. In the embodiment shown, TGr is driven to a negative potential, $V_{TG\text{-}Neg}$, following the photodetector reset operation (e.g., immediately after concurrent assertion with TGc or at the conclusion of the reset phase), thereby establishing a low-leakage isolation between the photodetector and floating diffusion, and reducing dark current from the region below TGr. Also, because the row and column control signals are jointly applied to adjacent transfer gate elements, TGc may be raised and lowered as necessary following the photodetector reset operation and during the ensuing integration phase (phase 2) without undesirably floating the transfer gate. Thus, TGc is lowered following pixel reset and, while shown as remaining low throughout the ensuing integration and noise sampling phases (phases 2 and 3), will toggle between high and low states during those phases to support reset and read-out operations in other pixel rows.

The noise or reset sampling operation within phase 3, overthreshold detection within phase 4 and conditional read-out (or conditional transfer) within phase 5 are carried out generally as discussed in reference to FIG. 9 or FIG. 13, except that TGc need only be raised in conjunction with the TGr pulses (i.e., to $V_{TG\text{-}Partial}$ and $V_{TG\text{-}Full}$) during the partial-transfer and conditional-transfer operations. In the embodiment shown, a quad-potential TGr driver is provided within the row decoder/driver (e.g., within element 305 of FIG. 19) to maintain TGr at the negative potential throughout the integration phase, and then step TGr up to a pre-read potential (zero volts in the example shown) at the start of the noise sampling phase before raising TGr further to $V_{TG\text{-}Partial}$ and finally to $V_{TG\text{-}Full}$ in the overthreshold detection and conditional read-out operations, respectively. In alternative embodiments, a three-potential driver may be used to maintain TGr at the negative potential except when pulsed to $V_{TG\text{-}Partial}$ or $V_{TG\text{-}Full}$ (i.e., no pre-read potential). The TGc line may also be kept high during the overthreshold detection phase, and only goes low for columns that do not meet the over-threshold condition. As shown in detail view 191, the SHS line may be omitted in favor of a $CV_{RMP}$ line in an in-pixel ADC embodiment, with the latter pulsed during overthreshold detection phase 4 and then ramped during conditional read-out phase 5.

PMOS Transfer-Enable Pixel

Figure 16:
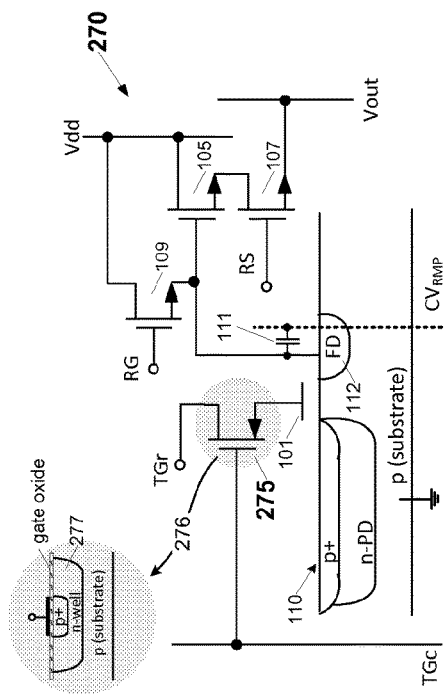
FIG. 16 illustrates an alternative embodiment of a conditional-read pixel in which the transfer-enable transistor is implemented by a PMOS transistor instead of the NMOS transistor used in the conditional-read pixel of FIG. 8.

FIG. 16 illustrates an alternative embodiment of a conditional-read pixel 270 in which the transfer-enable transistor (i.e., transistor switched between conducting and non-conducting states by the TGc signal) is implemented by a P-type transistor 275 (P-type MOSFET or PMOS transistor) instead of the N-type transistor 103 (NMOS) used in conditional-read pixel 100 of FIG. 8 (transfer gate 101, photodiode 110, floating diffusion 112, and transistors 105, 107 and 109 may be implemented and interconnected generally as described in reference to FIG. 8). As with pixel embodiments discussed above, an optional $CV_{RMP}$ line may be routed column-wise across pixel 270 to effect a capacitive coupling 111 with respect to floating diffusion node 112 and thus enable in-pixel ADC operation (e.g., as described in reference to FIGS. 1-7 and 12-13).

Figure 17:
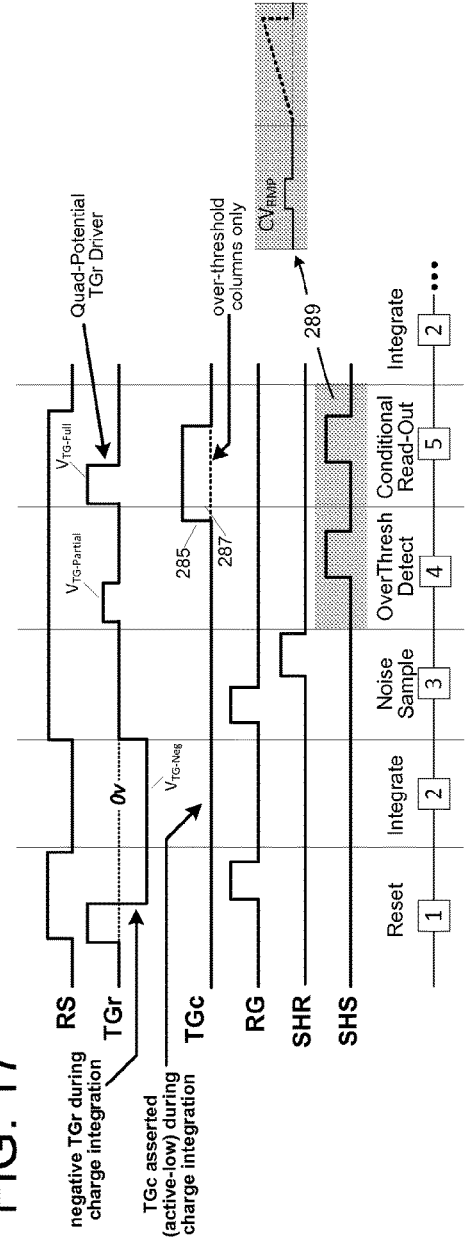
FIG. 17 is a timing diagram illustrating an exemplary pixel cycle (reset/charge integration/read-out) within the pixel embodiment of FIG. 16.

Referring to the exemplary pixel cycle diagram in FIG. 17, the PMOS transfer-enable transistor 275 enables a negative TGr signal ($V_{TG\text{-}Neg}$) to be applied to transfer gate 101 during charge integration intervals (in contrast to the NMOS transfer-enable transistor shown in FIG. 8 in which such negative TGr potential would undesirably forward-bias the P-N junction between the substrate and the source/drain regions of the transistor), thereby improving sensor SNR by reducing subthreshold leakage from photodiode 110, and reducing dark current from transfer gate 101. As shown, the column transfer-gate control signal TGc becomes active-low instead of active-high and may be held active (i.e., driven low) at all times except during the conditional read/reset operation in the final phases of the pixel cycle. In the embodiment shown, for example, just prior to assertion of $V_{TG\text{-}Full}$ on the TGr line (i.e., at 285), the TGc line is deasserted (raised) for columns where the pixel is below threshold, and remains asserted (lowered) at 287, for overthreshold columns only. That is, TGc is asserted (driven low) if an overthreshold condition was detected in the previous phase, and deasserted (maintained in the high state) for the duration of the $V_{TG\text{-}Full}$ pulse if no overthreshold condition was detected. Note that, while shown as being held active throughout the charge integration interval, the TGc signal will in actuality be conditionally pulsed during that interval (and possibly others) to complete conditional readout operations for other rows of pixels. As shown in detail view 289, the SHS signal line may be omitted in favor of a $CV_{RMP}$ line in an in-pixel ADC embodiment, with the latter pulsed during overthreshold detection phase 4 and then ramped during conditional read-out phase 5.

Referring again to FIG. 16, although PMOS transistor 275 consumes a larger die area than an NMOS counterpart (i.e., by virtue of the n-well 277 formed within the substrate to implement PMOS transistor 275 as shown in detail view 276), this additional die area may be available in image sensor having larger pixels (e.g., an image sensor of a digital single-lens reflex (DSLR) camera). Also, in a number of embodiments, PMOS transistor 275 is implemented in a separate die from the die containing photodiode 110 and other pixel structures. In one such embodiment, the two dies (or more) may be stacked with back-to-back contact surfaces in a three-dimensional (3D) integrated-circuit configuration, thus enabling direct contact between an array of PMOS transistors 275 formed in one die and an array of remaining pixel elements (i.e., specifically, coupling drain terminals of the PMOS transistors to gate terminals of transfer gates 101) formed in the other die. In that case, the pixel die may be fabricated to enable backside illumination, with frontside contact to the die containing the array of PMOS transfer-enable transistors 275.

Read-Out Masking Pixel

In conditional-read pixel embodiments described thus far row and column control signals are, in effect, logically ANDed to activate a transfer gate (i.e., establish a conduction channel) between the photodiode and floating diffusion of a pixel—the logical AND being effected, for example, through a transfer-enable transistor that applies a TGr potential to the transfer gate only if TGc is asserted, or a dual-control (split) transfer gate in which the conduction channel is formed only if both TGc and TGr are asserted.

Figure 18:
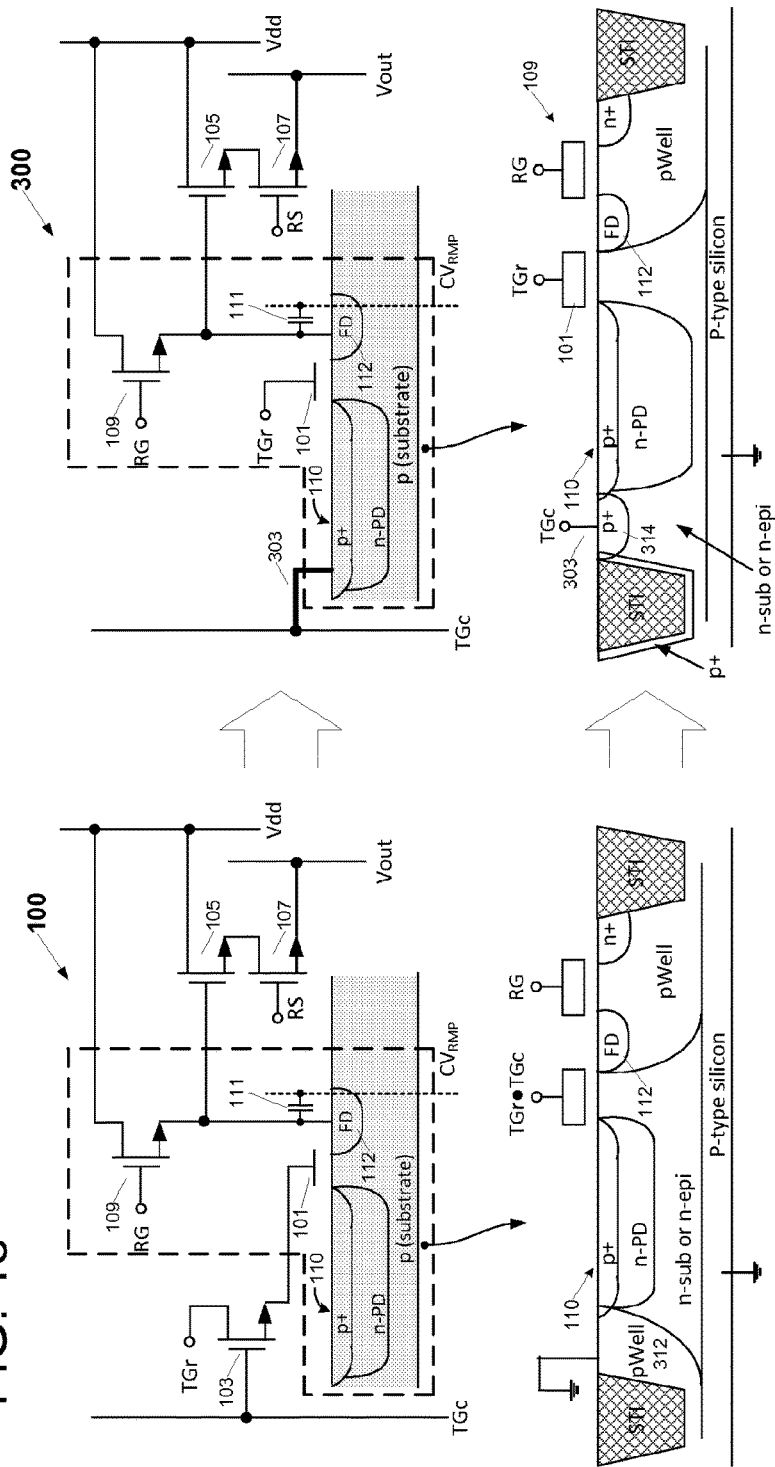
FIG. 18 illustrates an alternative embodiment of a conditional-read pixel in which the transfer gate is controlled directly by the row control signal, TGr, with the column control signal, TGc, being applied to dynamically adjust the photodiode depletion voltage.

FIG. 18 illustrates an alternative embodiment of a conditional-read pixel 300 in which transfer gate 101 is controlled directly by row control signal TGr, and in which column control signal TGc is applied to the pinning layer of photodiode 110 to dynamically adjust the photodiode depletion potential. By this arrangement, instead of controlling the state of the transfer gate based on a logical AND of the row and column control signals, during read operations the transfer gate is driven to the same partial or full transfer potential for each pixel on a current row and thus not used to control selective readout, and, instead, the photodiode depletion voltages for each of the pixels along the row are manipulated according to the state of the column control signal to enable or mask (suppress) charge transfer from photodiode 110 to floating diffusion 112.

As can be seen by comparing the exemplary architecture and layout diagrams for conditional-read pixel 300, referred to herein as a "read-out masking pixel," with conditional-read pixel 100 (copied from FIG. 8), transfer-enable transistor 103 is omitted altogether from read-out masking pixel 300, with the TGr line coupled directly to transfer gate 101 and TGc coupled to the p+ pinning implant as shown at 303. This arrangement enables the depletion potential of the photodiode to be dynamically raised and lowered under control of the TGc signal. More specifically, when read-out masking is desired, TGc may be raised to drive the photodiode depletion potential to a level that prevents full charge transfer despite formation of a normal transfer channel potential between the photodiode and floating diffusion (i.e., despite applying $V_{TG-Full}$ at transfer gate 101). More specifically, as illustrated in the electrostatic-potential diagram of FIG. 19 (showing the potential across device section A-A'), shifting TGc to a more positive voltage (positive being in the downward direction), correspondingly increases the depletion potential, $V_{PIN}$, of the pinned photodiode, thereby preventing charge transfer by moving the depletion potential below the channel potential that results when TGr is raised to $V_{TG-Full}$ (exemplary TGr levels corresponding to the $V_{TG-Off}$ and $V_{TG-Partial}$ potentials are also shown). Alternately stated, the fully depleted potential or pinned diode potential is designed to be large or deep when 0V is applied to the pinning layer. As a result, the application of $V_{TG-FULL}$ to the TG does not provide full charge transfer from the PD. By applying a negative voltage to the pinning layer, $V_{PIN}$ is reduced to a point where the application of $V_{TG-FULL}$ to the TG does provide full charge transfer from the PD. Note that, as with pixel embodiments discussed above, an optional $CV_{RMP}$ line may be routed column-wise across pixel 300 to effect a capacitive coupling 111 with respect to floating diffusion node 112 and thus enable in-pixel ADC operation.

Returning to FIG. 18 and comparing the exemplary layout cross-sections for conditional-read pixels 100 and 300, it can be seen that the p-well 312 within pixel 100 that interconnects the pinning implant (p+ layer of photodiode 110) to the grounded substrate region (thereby grounding the pinning implant and establishing a depletion voltage at some positive potential according to the n– dopant concentration of the photodiode, n-type substrate region, and surrounding p-type regions) is omitted in pixel 300 in favor of a P+ diffusion region 314 coupled to column control line, TGc (i.e., by interconnect 303). By this arrangement, the potential of the TGc line controls the potential of the pinning implant and thus the depletion voltage of photodiode 110 (which is offset from the pinning implant potential in accordance with the dopant concentrations of the photodiode diode and surrounding regions). Except for a possible change in photodiode dopant concentration (as discussed below), no other significant changes in the pixel implementation are required, as the shallow-trench isolation structures (STI), transfer gate 101, floating diffusion 112 and reset transistor 109 (as well as transistors 107 and 105, not shown) may be implemented in the same way in each of the two pixel embodiments.

FIG. 20 presents an exemplary pixel cycle diagram corresponding to the read-out masking pixel of FIG. 16, showing a corresponding version of the five-phase operation discussed above with respect to other pixel embodiments. Except for the column control signal, TGc, the signal waveforms generally correspond to those shown in FIG. 15 for the split-gate pixel embodiment (including the ability to hold TGr negative during integration). More specifically, because the TGc signal is now used to control the photodiode depletion potential, TGc is generally held at a negative potential during charge integration and then selectively raised to a readout-masking potential (0 v in this example) only during the full read-out phase of the pixel cycle. More specifically, if the partial-read result indicates an overthreshold condition, or if an unconditional read is to be executed, TGc is maintained at the negative potential through the conditional read-out phase (phase 5) or at least until the full-read sample is captured (sometime after the second rising edge of SHS). By contrast, if the partial-read result indicates an underthreshold result, the TGc signal is raised to the masking potential for an interval that spans the $V_{TG-Full}$ pulse duration, thereby shifting the photodiode depletion potential to a sufficiently positive voltage to suppress full charge transfer from the photodiode to the floating diffusion despite application of the $V_{TG-Full}$ potential on the TGr line—in effect, masking the photodiode readout that would occur if TGc remained at the negative potential. As shown in detail view 325, the SHS signal line may be omitted in favor of a $CV_{RMP}$ line in an in-pixel ADC embodiment, with the latter pulsed during overthreshold detection phase 4 and then ramped during conditional read-out phase 5.

FIG. 21 illustrates relative electrostatic states of the photodiode 110, transfer gate 101 and floating diffusion 112 during the charge-integration and read-out phases of the pixel operation, contrasting pixels having conditionally-enabled transfer gates (e.g., as in pixel 170 of FIG. 14) in the upper half of FIG. 21, with read-out masking pixels having conditionally-shifted photodiode depletion potentials in the lower half of FIG. 21. Referring first to the bright-light (high light) example shown in the left side of FIG. 21, similar pixel cycle operations are carried in the conditionally-enabled transfer gate pixel (upper left quadrant of FIG. 21) and read-out masking pixel (lower left quadrant) as, in each case, the overthreshold condition detected during the partial-read phase (i.e., when $V_{TG-Partial}$ is applied on the TGr line to partially lower the electrostatic barrier between the photodiode and floating diffusion) is followed by applying $V_{TG-Full}$ to the transfer gate to fully lower the electrostatic barrier between the photodiode and floating diffusion and thus permit full transfer of charge integrated within the photodiode to the floating diffusion. One operational difference to be appreciated in this regard is that the application of $V_{TG-Full}$ on the TGr line is conditioned on assertion of TGc in the conditionally-enabled transfer gate pixel, but carried out unconditionally in the read-out masking pixel. Another notable difference is the pinning layer potential, $V_{PL}$, employed in the two pixel architectures. That is, in the conditionally-enabled transfer gate pixel, the pinning layer is fixed at zero volts, with the photodiode dopant concentration being sufficient to establish a depletion voltage, $V_{PIN}$ at a desired potential more positive than $V_{TG-Partial}$ and more negative than $V_{TG-Full}$. By contrast, in the read-out masking pixel, a negative TGc signal is applied to drive the pinning layer negative while an increased dopant concentration within the photodiode maintains the photodiode depletion voltage at the desired potential between the $V_{TG-Partial}$ and $V_{TG-Full}$ voltage levels. That is the photodiode is fabricated with a raised dopant concentration to increase the pinned diode potential $V_{PIN}$, thereby counteracting the more negative pinning layer potential (i.e., when TGc is at the lower, non-masking signal state) to maintain approximately the same photodiode depletion voltage as in the conditionally-enabled transfer gate pixel.

Referring now to the exemplary low-light operations shown in the rightmost half of FIG. 21, the underthreshold detection during the partial-read phase of the conditionally-enabled transfer gate pixel results in deassertion of the TGc signal during the full-read phase, thus blocking application of $V_{TG-Full}$ to prevent charge transfer between the photodiode and floating diffusion. By contrast, in the read-out masking pixel, $V_{TG-Full}$ is applied to TGr despite the underthreshold detection (i.e., $V_{TG-Full}$ is applied unconditionally to all pixels on the current row), with charge-transfer instead being blocked on selected pixels by raising the TGc signal level (and thus the pinning layer potential) so as to correspondingly raise the photodiode depletion potential (i.e., moving $V_{PIN}$ downward in the diagram of FIG. 21) to a level that maintains the electrostatic barrier between the photodiode and floating diffusion, and a photodiode potential well that is large enough so the underthreshold charge level does not reach or exceed the TG channel potential. In the example shown, TGc is raised to the masking potential (i.e., zero volts in this example) in response to the underthreshold detection, thus maintaining the electrostatic barrier between the photodiode and floating diffusion at a level at least as high as the electrostatic barrier applied during the partial read phase (i.e. when TGc is negative and $V_{TG-Partial}$ is applied to the transfer gate). In alternative embodiments, TGc may be raised to a masking potential above zero volts and/or the dopant concentration within the photodiode may be increased so as to enhance the electrostatic barrier between the photodiode and floating diffusion during the read-out masking operation.

FIGS. 22A and 22B illustrate an alternative read-out sequence in which TGc is maintained at 0 v during charge integration, raising the photodiode depletion potential (and thus effectively increasing the full well capacity) relative to the read-out sequence of FIGS. 20 and 21. As shown in the exemplary low-light and high-light electrostatic diagrams of FIG. 22B, threshold assessment may be carried out by applying $V_{TG-Full}$ (instead of $V_{TG-Partial}$) to the transfer gate, as this voltage will not fully empty the diode. Also, instead of separate TGr pulses, a single $V_{TG-Full}$ pulse may be applied on the TGr line during an extended interval that spans both the overthreshold detection and conditional read-out phases of the pixel cycle. In alternative embodiments, respective (separate) $V_{TG-Full}$ pulses may be generated during the overthreshold conditional read-out phases of the pixel cycle. Also, a $V_{TG-Partial}$ voltage somewhat lower than $V_{TG-Full}$ may be applied during the overthreshold phase. In any case, if charge is detected for a pixel within a given column during the threshold assessment (i.e., overthreshold condition detected), then the TGc line for that column is lowered (i.e., to a negative voltage) to effect a full transfer of the remaining charge from the photodiode to the floating diffusion as shown in the high light example of FIG. 22B. In the case of underthreshold determination for the pixel within a given column, the TGc line for that column is maintained at 0 v to permit continued integration. This operation is shown in the low light example (right-hand side) of FIG. 22B. Also, as shown at 335, the SHS signal line may be omitted in favor of a $CV_{RMP}$ line in an in-pixel ADC embodiment, with the latter pulsed during overthreshold detection phase 4 and then ramped during conditional read-out phase 5.

FIG. 23 illustrates an exemplary pixel array 340 showing two columns (341) of read-out masking pixels. For simplicity, only the photodiode (PD), transfer gate (TG) and floating diffusion elements of each pixel are shown, with the transfer gate for each row of pixels 'i' coupled to a respective row control line (TGr[i], where 'i' ranges from 0 to n−1). In the embodiment shown, a shared photodiode pinning layer (PL) extends across each pixel column 341 and is coupled to a respective column control line (TGc[j], where 'j' ranges from 0 to m−1). Alternately stated the pinning layer for the pixels in a single column are electrically connected, while being isolated from the pinning layer of adjacent columns. In alternative embodiments, a separate pinning layer may be provided for each pixel with a given column or for subgroups of pixels within a column (i.e., each such pinning layer spanning the photodiodes within of a group of more than one but fewer than n pixels), with each such pinning layer being driven by a separate control line or coupled together, for example, via a metal-layer interconnect. In any case, the pinning layer or pinning layers may be considered as forming a component of the spanned or (adjacent) photodiode(s).

FIGS. 24A-24C are directed to an alternative embodiment of an integrated-circuit imaging device in which all pixel read-out operations are executed unconditionally through concurrent assertion of transfer gate and pinning-voltage control signals, TG and PV. Referring first to the embodiment of FIG. 24A, because all pixels 360 in a selected row 363 (or group of rows in a binned read operation) are read-out unconditionally and concurrently, the TG and PV inputs of each pixel in that pixel row 'i' may be coupled in common to TGi and PVi row control lines. Also in this embodiment, the pinning layers of pixels in a row are electrically connected to each other (or implemented by a continuous pinning layer that spans all pixels in the row in a manner corresponding to the column-spanning pinning layer shown in FIG. 23, or multiple interconnected pinning layers that each span a subset of pixels in the row) while being isolated from other p-type regions in the pixel and isolated from the pinning layer of pixels in adjacent rows. Those lines, in turn, may be driven deterministically by row logic 370 throughout the pixel cycle. This operation is shown in greater detail in the timing diagram of FIG. 24B, which shows the concurrent high-going and low-going pulses TG and PV pulses applied to enable hard reset (phase 1) and unconditional read-out (phase 4 as there is no overthreshold detection phase in this case). The row logic 370 may assert the read-out select signals (RS) and reset-gate control signals (RG) for each pixel row as generally described above (and shown in FIG. 24B). As shown at 362 in FIG. 24A, a $CV_{RMP}$ line may be routed column-wise across pixel 360 to effect a capacitive coupling 111 with respect to floating diffusion node 112 in an in-pixel ADC embodiment. In that case, the SHS signal line may be omitted and unconditional read-out effected instead by driving a ramp signal onto the $CV_{RMP}$ line (i.e., as shown at 375 in FIG. 24B) to yield a pixel-coupled ADC result.

FIG. 24C illustrates the electrostatic arrangement that results during the integration and read-out phases shown in FIG. 24B. As shown, maintaining the row-based pinning-layer control signal PG at 0 v during charge integration enhances (increases) the full well capacity of the photodiode as generally described in reference to FIGS. 22A-22B.

Figure 25:
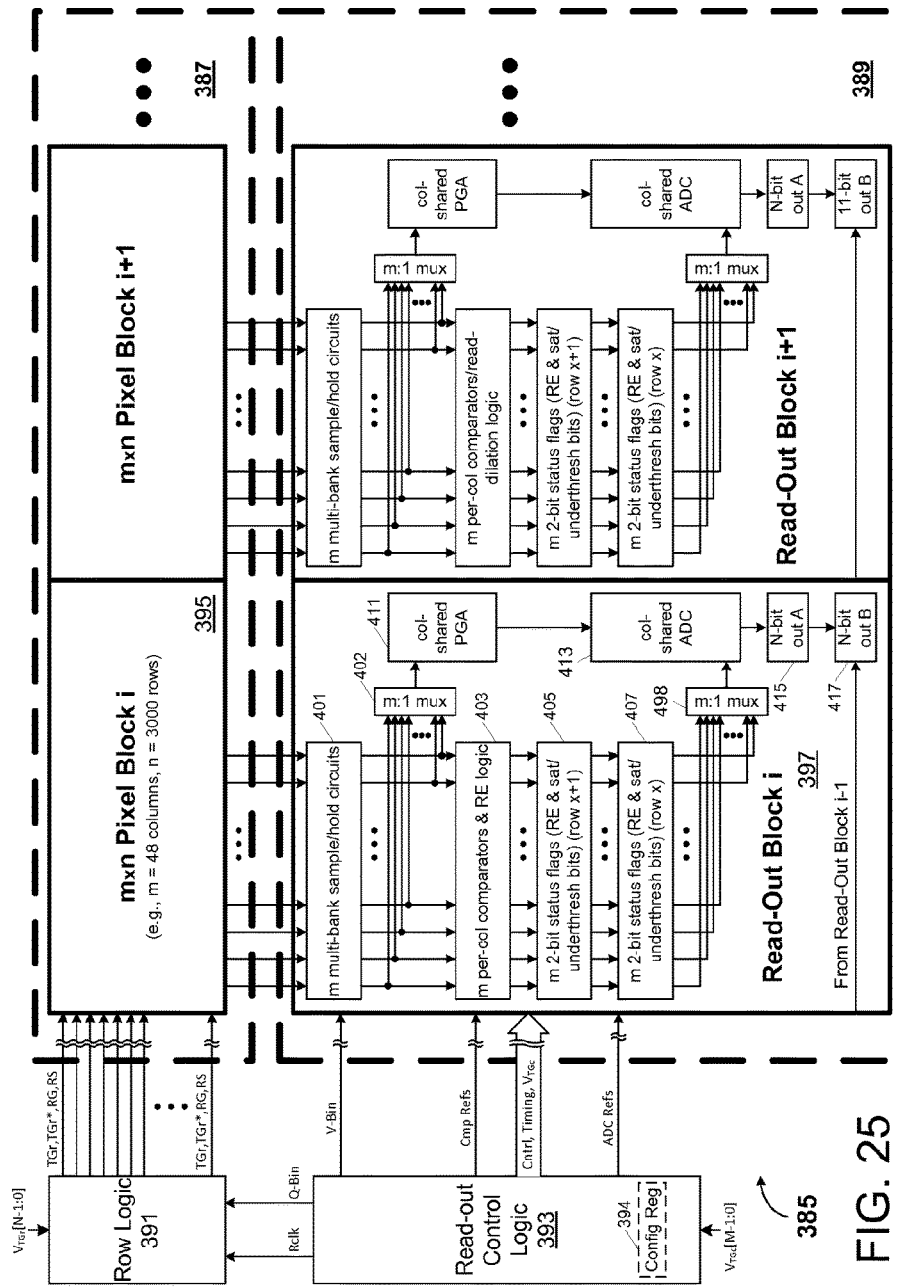
FIG. 25 illustrates an embodiment of an image sensor having a conditional read pixel array, column read-out circuitry, row logic and read-out control logic.

During the read-out phase, the transfer gate signal TG is raised (e.g., to $V_{TG-Full}$) while PV is driven to a negative potential, thereby enabling full charge transfer from the photodiode to floating diffusion. Through this dual-control approach, the full well capacity of the PD can be increased relative to conventional pixel architectures and the trade-off otherwise required between FD voltage range and $V_{pin}$ can be relaxed. Additionally, a lag-free PD and TG structure may be more easily achieved without the need for a $V_{TG-Full}$ that is charged pumped beyond the sensor array voltage supply levels Sensor Architecture FIG. 25 illustrates an embodiment of an image sensor 385 having a conditional read pixel array 387, column read-out circuitry 389, row logic 391 and read-out control logic 393. In the example shown, pixel array 387 is organized in a number of pixel blocks 395, only two of which are depicted (i.e., pixel block 'i' and pixel block 'i+1'), with each pixel block containing m columns and n rows of conditional-read pixels (e.g., m=48, n=3000, though other row/column dimensions may apply). Column read-out circuitry 389 is similarly organized in a number of read-out blocks 397 (only two of which are shown), each coupled to receive output signal lines (i.e., data lines) from a respective pixel block 395.

Though not specifically shown, each column of pixel array 387 is populated by shared-element pixels in which every four pixels form a quad pixel cell (e.g., shared floating diffusion to permit charge-binning as described in reference to FIG. 8, as well as shared reset, read-select and amplifier transistors). Similarly, though not shown, sample and hold circuitry within each read-out block includes switching elements to enable voltage-binning of same-color-plane pixels in different pixel columns. Thus, pixel array 387 may be selectively operated in charge-binned and/or voltage-binned read-out modes during all or selected subframes of an image frame interval in accordance with one or more binning control signals (e.g., "Q-Bin" and "V-Bin") from read-out control logic 393, thereby enabling binning operations to be performed selectively within each subframe. In alternative embodiments, the disposition of shared floating diffusion and/or switchably shared sample and hold elements within the pixel and read-out blocks may be organized in other pixel group configurations (e.g., 2×2 quad pixel groups that span two rows and two columns instead of four pixels within the same column).

Still referring to FIG. 25, row logic 391 outputs a shared row-select signal (RS) and reset-gate signal (RG) to each row of quad-pixel cells, and outputs independent row transfer-gate control signals ($TGr_1$-$TGr_4$) to drain terminals of respective transfer-enable transistors (or directly to transfer-gate terminals in a split-gate embodiment) within individual pixels. Thus, row logic 391 may be implemented with one row-select and reset-gate signal per each group of four rows. In an implementation in which row logic 391 sequences incrementally through the rows of pixel array 387 (e.g., pipelining reset, integration and progressive read-out operations with respect to the rows of pixel array 387 such that one row is read-out after another), row logic 391 may include circuitry to assert the RG, RS and TGr signals at the appropriate time for each row, for example, synthesizing those signals with respect to a row clock (Rclk) from read-out control logic 393. Alternatively, row logic 391 may receive individual timing signals corresponding to each or any of the RG, RS and TGr signals, multiplexing any individual enable pulse onto the corresponding RG, RS, or TGr lines of a selected row at the appropriate time.

In one embodiment, row logic 391 receives transfer-gate control voltages corresponding to the off, partially-on and fully-on states shown in FIGS. 9, 10 and 11 (i.e., $V_{TG-Off}$, $V_{TG-Neg}$, $V_{TG-Partial}$, $V_{TG-Full}$) from an on-chip or off-chip programmable voltage source, switchably coupling each of the different control voltages to a given transfer-gate row line at a deterministic time. The $V_{TG-Partial}$ voltage may be calibrated to compensate for control-voltage and/or performance variations (i.e., non-uniformity) across the pixel array.

Continuing with FIG. 25, each read-out block 397 includes a set of m (per-column) multi-bank sample and hold circuits 401, a corresponding set of m comparators and read-enable logic circuits 403, m:1 multiplexers 402 and 408, column-shared programmable gain amplifier 411 and column-shared ADC circuit 413. As shown, separate pairs of buffers are provided to store read-out status flags and ADC output values. More specifically, a pair of flag buffers 405 and 407 are provided to double-buffer per-column read-out status flags (i.e., a read-enable bit and a saturation/underthreshold bit, RE and S/U, for each of the m pixel columns), with flag buffer 405 storing the status flags for row x+1, and flag buffer 407 storing status flags for row x, thus enabling status flag generation (i.e., threshold-comparison operations) with respect a given row (x+1) while the status flags for the prior row (x) are delivered one after another (via multiplexer 408) to column-shared ADC 413 to support selective ADC operations. In the embodiment shown, the column-shared ADC circuits perform successive-approximation conversion to yield N-bit outputs and thus carry out N voltage-comparisons (with respective ADC references) per ADC conversion result. In alternative embodiments, ramped (e.g., single-slope) ADC operations may be executed by the column shared ADCs and/or in-pixel ADC operations may be carried out as discussed in reference to FIG. 8. Read-out control logic 393 (which may include a configuration register 394 to enable programmable selection of configuration options) outputs comparator references (Cmp Refs), control and timing signals (Cntrl, Timing) and ADC refs (ADC Refs) to the read-out blocks 397, together with the voltage-bin mode signal (V-Bin) mentioned above. Read-out control logic 393 may also output the above-described row clock (Rclk), as well as a charge-bin mode signal (Q-Bin) to row logic 391, thus enabling the sequencing logic therein to assert TGr signals in parallel or staggered fashion according to the specified charge binning mode. Row logic 391 may assert feedthrough nulling pulses ("TGr*") on shared or dedicated row lines as discussed above, and/or read-out control logic 393 may drive nulling pulses on shared or dedicated column lines (e.g., $CV_{RMP}$ as discussed above) and thus may receive one or more column-control voltage sources, shown as $V_{TGc}[M-1:0]$.

Still referring to FIG. 25, a single-column ADC output storage buffer pair 415/417 (e.g., a 13-bit storage element to permit storage of a 12-bit ADC value and logic '1' read-enable flag or a logic '0' read-enable flag together with a saturation/underthreshold flag) is provided to enable double-buffering of ADC values generated in succession for respective pixel columns. More specifically, output-stage buffer 417 is provided to store the ADC value for a given pixel column and deliver that ADC value to downstream logic (including a physical signaling interface (PHY)), concurrently with generation of the ADC value for a subsequent pixel column and storage of that subsequent-column ADC value in input-stage buffer 415. In the embodiment shown, the output-stage buffers 417 for respective read-out blocks 397 are coupled in an output shift register to enable sequential output of per-block ADC output values (e.g., at a rate of PB times the per-column ADC output rate, where PB is the number of pixel blocks in the pixel array) to downstream logic. Consequently, the stream of ADC output values delivered to downstream logic (including circuitry within an off-chip image processor) are column interleaved, with each set of K ADC output values including single value from each of K pixel blocks (with m sets of K ADC output values being output in sequence). In alternative embodiments, the output-stage buffers or any number of groups of output buffers may deliver output values in parallel to downstream logic instead of delivering one pixel column read-out result at a time.

In a number of embodiments, column-sharing of SAR (successive-approximation register) ADC circuitry is compelled by design constraints. Assuming, for example, a 4× oversampled 3000 row, 30 frame-per-second image sensor having a per-pixel resolution of 12 bits, then the time available for reading out each pixel row of the image sensor, or row "time slot" is $(30*3000*4)^{-1}$ sec, and thus 2.78 μS. Consequently, despite its compact implementation and low noise operation, a single-slope ADC circuit would require $2^{12}$ compare operations per row time slot, and thus a 1.47 GHz compare frequency—a compare frequency likely to be impractical for many imaging applications. And, while a SAR ADC requires only N compares to generate an N-bit ADC, SAR ADC circuits tend to consume considerable die area and power. Accordingly, by sharing a SAR ADC between a number of columns that balances, for a given set of design constraints, the compare frequency with die area consumption, a working solution may be achieved. In the example of FIG. 25, for instance, sharing a 12-bit SAR ADC circuit between 48 columns requires a readily feasible 12*48=576 compare operations per row time slot, and thus a compare frequency approximately 7 times lower than that required by 12-bit single-slope ADC.

FIG. 26 illustrates an alternative ADC arrangement in which a monotonic-ramp generator implements a visually lossless lookup (VLL) function to compress the total ramp count (i.e., number of ramp steps) by 3 bits and thus by a factor of 8. Accordingly, instead of deploying more noise-prone column-shared 12-bit SAR ADCs, the VLL-encoded ADC ramp is supplied to comparators within respective per-column read-out circuits across the image sensor to enable ramped, low-noise ADC operation.

In the embodiments herein, the visually lossless lookup function encodes linear pixel values into a form that is, e.g., logarithmic, partially linear and partially logarithmic, or following some other function with the encoded pixel values requiring fewer bits, but maximizing representational precision from the standpoint of human visual perception. For instance, the exemplary VLL function encoded within the ramp generator of FIG. 26 has the following form:

$$y(x) = \text{round}\left(\begin{cases} x, & x < k \\ b + a*\ln(x), & x \geq k \end{cases}\right),$$

where the values of a, b and k can be derived by applying the following constraints:
1. the function is continuous at k: $b+a*\ln(k)=k$;
2. the derivative of the function is continuous at k: $y'(x)=1$; and
3. The maximum output value is a known constant, m: $b+a*\ln(\text{saturation})=m$ The value "saturation" is the maximum value to be encoded. If b is the number of bits in the VLL output encoded space, then $m=2^b-1.5$. In this equation, 1.5 is subtracted instead of 1 so that only the saturation value produces the maximum encoded output value.

An exemplary derivation of VLL function parameters follows:

$$\text{The derivative of } y(x) \text{ is } y'(x) = \frac{a}{x}$$

$$\text{Applying (2), } \frac{a}{k} = 1 \rightarrow a = k$$

$$\text{Applying (1), } b + a*\ln(a) = a \rightarrow b = a - a*\ln(a)$$

$$\text{Applying (3), } a - a*\ln(a) + a*\ln(\text{saturation}) = m$$

For known values of saturation and m, the value of a can be computed using Newton's method.

$$f(a) = a - a*\ln(a) + a*\ln(\text{saturation}) - m$$

$$f'(a) = \ln(\text{saturation}) - \ln(a)$$

$$a(n+1) = a(n) - \frac{f(a(n))}{f'(a(n))}$$

Accordingly, a may be determined by picking a seed value for a and iterating until a converges, and then values of b and k may be calculated directly from the converged value of a.

In the embodiment of FIG. 26, a VLL-encoding ADC is realized by a global VLL-encoding ramp generator 425 that generates an inverse-VLL ramp signal ($V_{RAMP}$) and corresponding ramp step count (Dcnt). In the embodiment shown, the ramp signal is supplied to a sense amplifier 437 within per-column readout circuit 427 for comparison with a CDS representation of the photocharge integration level (i.e., difference between floating diffusion reset state and photocharge integration level captured in respective capacitive elements Crst and Csig in response to sample-and-hold control signals SHR and SHS applied, respectively, at the gates of transistors 431 and 433 and subtracted from one another in difference circuit 435). When the inverse-VLL ramp signal exceeds the CDS value, sense amplifier 437 drives $S_{OUT}$ high to latch the corresponding ramp step count within data output latch 439, thus completing the VLL-encoded ADC operation. As shown, the inverse-VLL ramp signal and corresponding step count are supplied to the per-column readout circuit for all pixel columns, thus enabling simultaneous ADC conversion of all pixel columns using a single (global) ramp generator. The global VLL-encoding ramp generator 425 can also be used as the ramp generator in FIG. 1 and similar in-pixel ADC embodiments.

An exemplary implementation of the VLL-encoding ramp signal generator 425 is illustrated in detail view 448. In the embodiment shown, ramp signal generator 425 includes a set of programmable registers 451 that parameterize an inverse-VLL function generator 450 which, in turn, outputs a 12-bit inverse-VLL ramp control value (Rctrl) and corresponding 9-bit step count (Dcnt) or ramp step count. A digital-to-analog converter 453 (DAC) receives the sequence of ramp control values generated by the inverse-VLL function generator 450 and outputs the corresponding analog voltages, thus driving an inverse-VLL $V_{RAMP}$ signal ($V_{RAMP}$) to the per-column pixel readout logic circuits for comparison with sampled pixel output signals.

The inverse VLL function implemented by inverse-VLL function generator 450 includes linear and exponential components that may be derived from known values of VLL function constants a, b, and k as follows:

$$x(y) = \begin{cases} y, & y < k \\ e^{(y-b)/a}, & y \geq k \end{cases}$$

The exponential equation $e^{(y-b)/a}$ can be rewritten as $(e^{1/a})^{(y-b)}$ or $\alpha^{(y-b)}$ where $\alpha = e^{1/a}$. Accordingly, inverse-VLL function generator 450 begins by ramping through the initial linear part of the inverse VLL function, sequencing the ramp control output incrementally from 0 to k−1. After k iterations, inverse-VLL function generator 450 outputs the first exponential ramp control value $\alpha^{(y_0-b)}$, multiplying that ramp control value (and each ramp control value output thereafter) by $\alpha$ to yield the subsequent ramp control value. For example, using this technique, a 12-bit linear ADC can be converted to a 9-bit VLL-encoding ADC in which a=k=110.72651, b=−410.470177, and $\alpha$=1.009072. Other input/output data sizes and VLL encoding parameters may apply in alternative embodiments.

In the exemplary inverse-VLL function generator of FIG. 26, linear and exponential components of the inverse-VLL function are rendered by a step counter 451 and product accumulator 463, respectively, with output multiplexer 471 provided to select between the step counter and product accumulator according to whether the linear component or exponential component of the inverse-VLL is being output during a given ramp step—a condition signaled by an exponent flag, "Exp." A ramp clock (rCK) is provided to advance the counter and re-load the accumulator for each ramp step, so that inverse-VLL function generator 450 may be viewed as a state machine that changes state during each ramp clock cycle.

In the embodiment shown, programmable register bank 451 is organized to account for the potentially different initial values of the exponential component (i.e., $\alpha^{(y_0-b)}$) that may apply for conditional and unconditional reads and/or for different conditional-read thresholds, and thus from one subframe to the next. Accordingly, the programmable register bank includes registers to store uniformly applicable $\alpha$ and k parameters, as well as subframe-dependent ramp parameters for each of up to four subframes (more or fewer subframes may be supported in alternative embodiments), including:

a conditional/unconditional read flag, "c/u," where c/u=1 indicates a conditional read and c/u=0 indicates an unconditional read;

the starting step count value, 'j', for a conditional-read subframe (note that, in the embodiment shown, steps 0 to j−1 are bypassed in a conditional-read subframe, truncating the overall step count range—in alternative embodiments, the available 9-bit step-count range may be re-coded to more resolutely span the remaining portion of the inverse-VLL function; and the initial exponential ramp control value for the subframe $\alpha^{(y_0-b)}$.

In the embodiment shown, the starting step count value for a conditional-read subframe, 'j', is assumed to be greater than the step count for the final value in the linear component, k, in all cases so that the linear component of the inverse-VLL function is bypassed entirely for such subframes. Accordingly, comparator 465 and logic OR gate 467 are provided to raise the exponent signal (Exp) if the output of the step counter is greater than k (a determination signaled by comparator 465) or if the c/u flag indicates a conditional-read subframe. Also, after reaching a final step count (and asserting a terminal count signal, TC, to advance subframe counter 481 and thus select inverse-VLL parameters for the next subframe via multiplexer 487), step counter 461 rolls over to either zero or T depending on the state of the c/u flag—a choice effected by multiplexer 479. Similarly, logic AND gate 473 and multiplexer 475 are provided to load (initialize) product accumulator 463 with the initial exponential ramp control value ($\alpha^{(y_0-b)}$) in the cycle following TC assertion (and thus at the start of a ramp for a new subframe) and to restore the accumulator to/maintain the accumulator in the initialized state whenever the exponent signal is low. Multiplier 477 generates the product of the accumulator output and compounding value, $\alpha$, with multiplexer 475 delivering that product to the load input of product accumulator 463 for any step count in which the exponent signal is high and the terminal count signal is low, thereby exponentially advancing the ramp control value within the product accumulator (i.e., raising $\alpha^x$ to $\alpha^{x+1}$) for each ramp step within the exponential-component step count range.

In the particular embodiment shown, the sizes of the step count (Dcnt) and ramp control value output by inverse-VLL function generator 450 are 9 bits and 12 bits, respectively. Accordingly, the 9-bit step count is padded with three 0-valued most-significant bits (MSBs) to yield a 12 bit ramp control value for the linear component of the inverse-VLL function. Continuing with exemplary bit sizes, product accumulator 463 maintains an addition 20 bits of fixed-point precision (and thus a 32-bit value in total), with the least significant 20 bits (i.e., the fraction portion of the accumulated value) being dropped to yield each successive exponential ramp control value. In the embodiment shown, the compounding value, $\alpha$, is implemented by a 21 bit fixed-point value, so that multiplier 477 generates a 53 bit product (i.e., 21+32 bits), the least significant 21 bits of which are dropped in the accumulator load operation. Any or all of these bit sizes may be different in alternative embodiments.

FIGS. 27A and 27B illustrate exemplary inverse-VLL profiles generated by VLL-encoding ramp signal generator 425 of FIG. 26. More specifically, FIG. 27A illustrates an exemplary inverse-VLL profile in the case of an unconditional-read subframe (i.e., c/u=0 so that 'j' is unused). As shown, the output voltage ramp proceeds linearly as the step count (Dcnt) is incremented from 0 to k, and then transitions to the initial exponential value ($\alpha^{(y_0-b)}$) in the subsequent ramp clock cycle, compounding by $\alpha$ in each rCK cycle thereafter. By contrast, in the inverse-VLL profile for a conditional-read subframe (i.e., c/u=1 as shown in FIG. 27B), the output voltage ramp starts at the exponential value corresponding to step count 'j' (i.e., the preceding values having been bypassed as demonstrated by the dashed portion of the output profile) and is compounded by $\alpha$ in each ramp clock cycle thereafter. Note that 'j' maybe set to a value slightly lower than the threshold count to account for pixel-to-pixel threshold variations. Also, rather than bypassing the portion of the output ramp corresponding to step counts 0 to j−1, the 9-bit step count space may be remapped to the required portion of the voltage ramp in alternative embodiments, thus providing greater stepwise resolution.

FIG. 28 illustrates an exemplary sequence of operations carried out by an image processor 501 to program a VLL-encoding image sensor 503 and thereafter recover full-resolution data from the image sensor output. Starting at 505, the image processor calculates inverse-VLL parameters to be applied in each subframe, for example, using the techniques described above, to generate values of α, $\alpha^{(j_0-b)}$, k and j. At 507, the image process programs the inverse-VLL ramp parameters within configuration registers 504 of the image sensor, for example, by outputting one or more programming commands ("Prog") together with operand data corresponding to the parameters to be programmed. In one embodiment, for example, configuration registers 504 correspond to (or include) registers 451 in FIG. 26, and the number of programming commands corresponds to the operand (parameter) size in relation to the physical signaling interface width and transmission burst length. In any case, after the inverse-VLL parameters have been programmed and the image sensor begins streaming out VLL-encoded pixel values (i.e., Dout values), the image processor applies an inverse VLL function to each pixel value to generate a corresponding uncompressed value (i.e., as shown at 509), in this example, restoring each 9-bit Dout value to a 12-bit pixel value.

Figure 29:
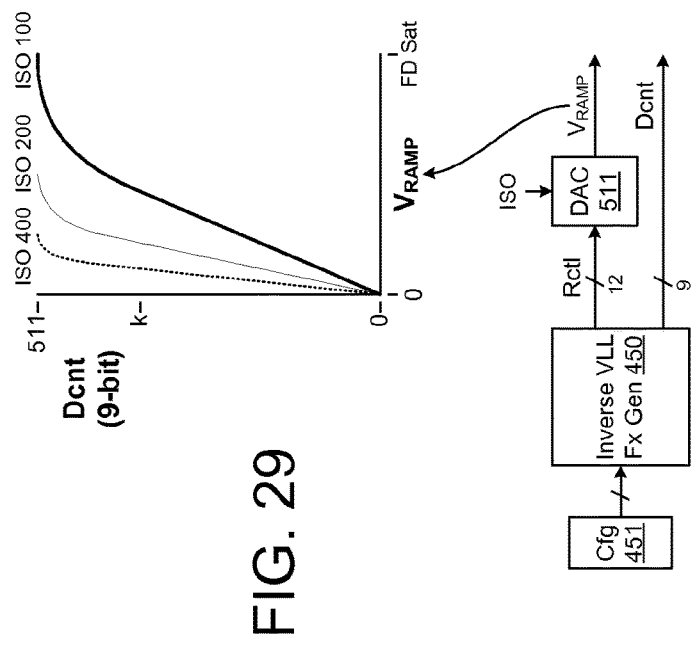
FIG. 29 illustrates exemplary ISO-correlated voltage ramp profiles that may be generated within a VLL-encoding analog-to-digital converter similar to that shown in FIG. 26.

FIG. 29 illustrates exemplary ISO-correlated voltage ramp profiles that may be generated within a VLL-encoding ADC similar to that shown in FIG. 26. In the embodiment depicted, an ISO setting (i.e., specifying a particular ISO setting within a range of settings) is supplied to DAC 511 which scales the voltage ramp output accordingly. By this operation, an exemplary ISO 100 setting yields a ramp profile generally as described in reference to FIGS. 26, 27A and 27B, while an ISO 200 setting halves each step in the voltage ramp relative to the corresponding ISO 100 ramp step, and an ISO setting 400 halves reach ramp step again, (quartering the ISO 100 ramp steps). This ISO-indexed ramp (or slope) scaling may be achieved, for example, by scaling reference voltages supplied to DAC 511 and/or selecting different sets of reference voltages (e.g., the reference voltages being scaled relative one another according to the desired ramp slope scaling). Alternatively, or additionally, the ISO setting may be used to scale the read-out conversion gain, thereby scaling the impact of each ramp step on the pixel output signal.

Figure 30:
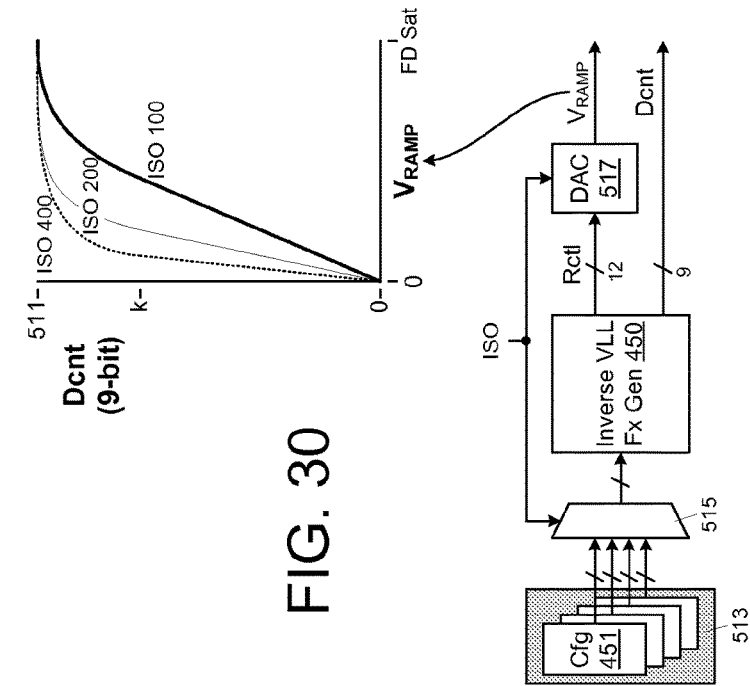
FIG. 30 illustrates an alternative set of ISO-correlated voltage ramp profiles that may be generated within a VLL-encoding analog-to-digital converter.

FIG. 30 illustrates an alternative set of ISO-correlated voltage ramp profiles that may be generated within a VLL-encoding ADC. In contrast to the constant scale factor applied to generate the ISO-correlated voltage ramps shown in FIG. 29, a constant scale factor is applied only to the linear portion of the voltage ramps in the embodiment of FIG. 30, with the exponential portion of the voltage ramp being recalculated for each ISO setting to achieve a voltage profile that extends to the floating diffusion saturation potential ("FD Sat"). In the particular implementation shown, the final step count, I', of the linear portion of the voltage ramp is assumed to be the same for each ISO setting, though this need not be the case (i.e., 'k' may be extended for higher ISO settings and the remaining Dcnt space coded to yield an exponential ramp to FD Sat). In one embodiment, the exponential ramp segment for each ISO setting is controlled by a respective set of configuration values which may include all or any subset of the ramp profile parameters described in reference to FIG. 26. As shown, a multiplexer 515 is provided to select between different sets of ramp parameters (each stored, for example, in a respective one of configuration registers 451 within register bank 513) in accordance with the ISO setting, forwarding the selected ramp parameters to inverse VLL function generator 450. The ISO setting may also be supplied to DAC 517 to effect linear scaling as described in reference to FIG. 29.

Figure 31:
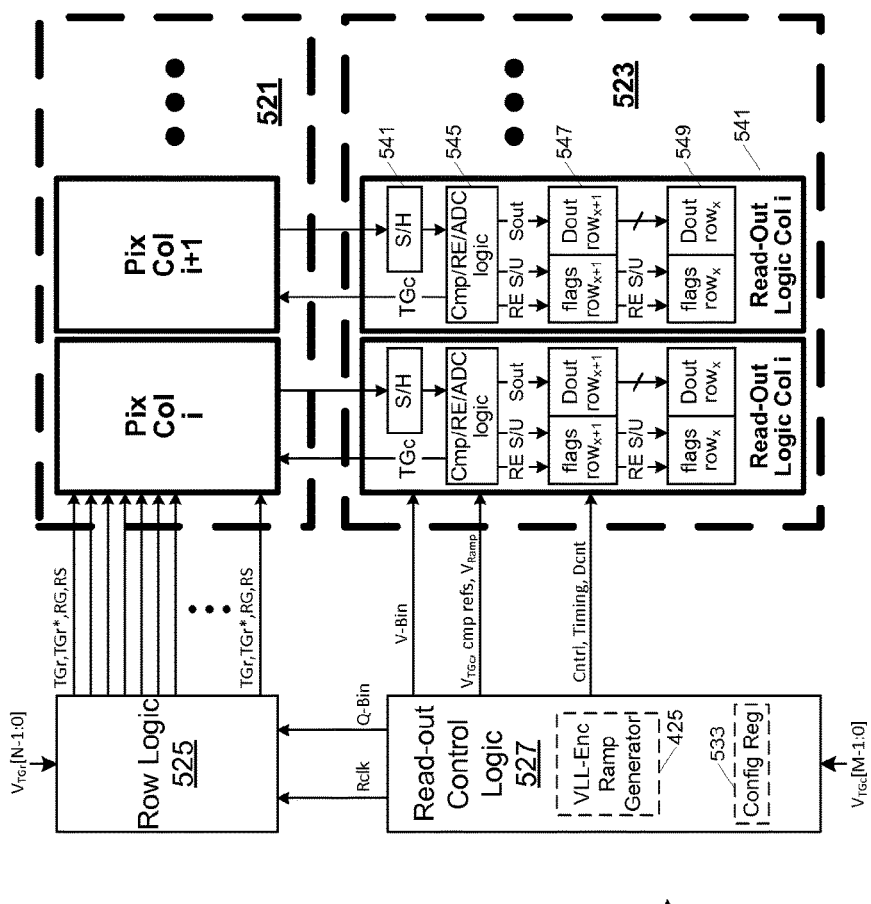
FIG. 31 illustrates an embodiment of an image sensor that incorporates the VLL-encoding ramp generator of FIG. 26.

FIG. 31 illustrates an embodiment of an image sensor 520 that incorporates the VLL-encoding ramp generator 425 of FIG. 26, including the various ISO-scaling options shown in FIGS. 29 and 30. In general, the image sensor architecture corresponds to that described in reference to FIG. 25, except that, instead of the column-shared PGA and SAR ADC, a low noise, monotonic-slope VLL-encoded ADC is implemented per pixel column. Thus, the row logic 525, and pixel array 521 are implemented generally as described in reference to FIG. 25 (though individual pixel columns are depicted, rather than blocks of pixel columns), and per-pixel column read-out logic 540 (the collection of which form read-out logic 523) includes a respective sample-and-hold bank 541 that operates generally as described above, together with comparator/read-enable/ADC logic 545. In one embodiment, comparator/read-enable/ADC logic 545 is implemented generally as described in reference to FIG. 25 (i.e., logic to compare the pixel output to respective compare reference voltages for purposes of detecting eclipse, under-threshold and saturation conditions, and logic to generate corresponding read-enable and saturated/underthreshold status flags) together with monotonic-slope ADC logic as shown within the per-column readout circuit of FIG. 26. That is, comparator/read-enable/ADC logic 545 includes a sense amplifier (which may also serve as a comparator for the eclipse, saturation and/or underthreshold references) that compares an analog CDS representation of the pixel state with the inverse-VLL voltage ramp generated by global VLL-encoding ramp generator 425 within readout control logic 527, asserting an Sout signal to capture the ramp step count as the digitized pixel value (Dcnt) when the voltage ramp exceeds the pixel state. Alternatively, the inverse-VLL voltage ramp may be applied to a column ramp line to enable in-pixel ADC conversion as generally described above in reference to FIGS. 1-7. As in the embodiment of FIG. 25, the read-out status flags and multi-bit pixel value are double buffered (i.e., within buffers 547 and 549) to permit the pixel data and status for a given row 'x' to be output concurrently with generation of the pixel data and status for the subsequent row 'x+1'. Note that VLL-encoding ramp generator 425 may be implemented generally as described in reference to FIG. 26, though the programmable register bank thereof may be consolidated with other configuration registers within register bank 533, thus enabling all the possible variants and configuration options described in connection with FIGS. 25 and 31 within image sensor 520.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific voltages, pixel array sizes, signal path widths, signaling or operating frequencies, component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "light" as used to apply to radiation is not limited to visible light, and when used to describe sensor function is intended to apply to the wavelength band or bands to which a particular pixel construction (including any corresponding filters) is sensitive. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

The section headings in the above detailed description have been provided for convenience of reference only and in no way define, limit, construe or describe the scope or extent of the corresponding sections or any of the embodiments presented herein. Also, various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A method of operation within an integrated circuit image sensor, the method comprising:
   generating first and second sequences of exponentially related reference voltages for respective first and second subframe intervals within an image frame interval, the first sequence of reference voltages including at least one reference voltage not included in the second sequence of reference voltages;
   comparing the first sequence of reference voltages with a first signal level representative of photocharge integrated within a pixel during the first subframe interval to identify a first reference voltage of the first sequence of reference voltages that is exceeded by the first signal level; and
   comparing the second sequence of reference voltages with a second signal level representative of photocharge integrated within the pixel during the second subframe interval to identify a second reference voltage of the second sequence of reference voltages that is exceeded by the second signal level.

2. The method of claim 1 wherein generating the first sequence of exponentially related reference voltages comprises generating a first sequence of exponentially increasing reference voltages together with a first step count sequence, each step count of the first step count sequence corresponding to a respective reference voltage within the first sequence of exponentially increasing reference voltages, and wherein comparing the first sequence of reference voltages with the first signal level representative of the photocharge integrated within the pixel to identify the first reference voltage comprises latching, as a first analog to digital conversion result, the step count within the first step count sequence that corresponds to the first reference voltage.

3. The method of claim 1 wherein second sequence of exponentially related reference voltages consists of more reference voltages than the first sequence of exponentially related voltage ranges.

4. The method of claim 1 wherein the first and second sequences of exponentially related reference voltages span respective first and second voltage ranges, the second voltage range exceeding the first voltage range.

5. The method of claim 4 wherein the first and second sequences of exponentially related reference voltages contain equal numbers of reference voltages such that the first voltage range is more resolutely subdivided by reference voltages than the second voltage range.

6. The method of claim 1 wherein first and second sequences of exponentially related reference voltages correspond to one or more visually lossless lookup functions.

7. The method of claim 1 wherein at least one of first and second sequences of exponentially related reference voltages comprises a subsequence of linearly increasing reference voltages together with a subsequence of exponentially increasing reference voltages.

8. The method of claim 1 wherein each of the first and second sequences of exponentially related reference voltages comprises a monotonic sequence of reference voltages.

9. The method of claim 1 wherein each of the first sequence of exponentially related reference voltages comprises a sequence of reference voltages in a successive approximation pattern to effect a binary search for the lowest one of the reference voltages in the first sequence that exceeds the first signal level.

10. The method of claim 1 further comprising executing a correlated double-sampling operation with respect to the pixel to generate the first signal level representative of photocharge integrated within the pixel.

11. An integrated circuit image sensor comprising:
a pixel to integrate photocharge during an image frame interval;
a control voltage generator to generate first and second sequences of exponentially related reference voltages for respective first and second subframe intervals within the image frame interval, the first sequence of reference voltages including at least one reference voltage not included in the second sequence of reference voltages; and
readout circuitry to (i) compare the first sequence of reference voltages with a first signal level representative of photocharge integrated within a pixel during the first subframe interval to identify a first reference voltage of the first sequence of reference voltages that is exceeded by the first signal level, and (ii) compare the second sequence of reference voltages with a second signal level representative of photocharge integrated within the pixel during the second subframe interval to identify a second reference voltage of the second sequence of reference voltages that is exceeded by the second signal level.

12. The integrated circuit image sensor of claim 11 wherein the control voltage generator to generate the first sequence of exponentially related reference voltages comprises voltage ramp circuitry to generate a first sequence of exponentially increasing reference voltages together counter circuitry to generate a first step count sequence, each step count of the first step count sequence corresponding to a respective reference voltage within the first sequence of exponentially increasing reference voltages, and wherein the readout circuitry to compare the first sequence of reference voltages with the first signal level representative of the photocharge integrated within the pixel to identify the first reference voltage comprises latching circuitry to latch, as a first analog to digital conversion result, the step count within the first step count sequence that corresponds to the first reference voltage.

13. The integrated circuit image sensor of claim 11 wherein second sequence of exponentially related reference voltages consists of more reference voltages than the first sequence of exponentially related voltage ranges.

14. The integrated circuit image sensor of claim 11 wherein the first and second sequences of exponentially related reference voltages span respective first and second voltage ranges, the second voltage range exceeding the first voltage range.

15. The integrated circuit image sensor of claim 14 wherein the first and second sequences of exponentially related reference voltages contain equal numbers of reference voltages such that the first voltage range is more resolutely subdivided by reference voltages than the second voltage range.

16. The integrated circuit image sensor of claim 11 wherein first and second sequences of exponentially related reference voltages correspond to one or more visually lossless lookup functions.

17. The integrated circuit image sensor of claim 11 wherein at least one of first and second sequences of exponentially related reference voltages comprises a subsequence of linearly increasing reference voltages together with a subsequence of exponentially increasing reference voltages.

18. The integrated circuit image sensor of claim 11 wherein each of the first and second sequences of exponentially related reference voltages comprises a monotonic sequence of reference voltages.

19. The integrated circuit image sensor of claim 11 wherein each of the first sequence of exponentially related reference voltages comprises a sequence of reference voltages in a successive approximation pattern to effect a binary search for the lowest one of the reference voltages in the first sequence that exceeds the first signal level.

20. The integrated circuit image sensor of claim 11 wherein the readout circuitry comprises sample-and-hold circuitry to execute a correlated double-sampling operation with respect to the pixel to generate the first signal level representative of photocharge integrated within the pixel.

* * * * *